US012615756B2

(12) United States Patent
Kim et al.

(10) Patent No.: US 12,615,756 B2
(45) Date of Patent: Apr. 28, 2026

(54) SEMICONDUCTOR DEVICE AND METHOD FOR FABRICATING THE SAME

(71) Applicant: SK hynix Inc., Gyeonggi-do (KR)

(72) Inventors: Seung Hwan Kim, Gyeonggi-do (KR); Seok Pyo Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 422 days.

(21) Appl. No.: 18/460,593

(22) Filed: Sep. 4, 2023

(65) Prior Publication Data

US 2024/0341076 A1     Oct. 10, 2024

(30) Foreign Application Priority Data

Apr. 10, 2023     (KR) ........................ 10-2023-0046839

(51) Int. Cl.
*H10B 12/00*      (2023.01)
*H01L 21/033*      (2006.01)
*H10B 41/40*      (2023.01)

(52) U.S. Cl.
CPC ......... *H10B 12/033* (2023.02); *H10B 12/482* (2023.02)

(58) Field of Classification Search
CPC .... H10B 12/033; H10B 12/482; H10B 41/20; H10B 41/30; H10B 41/40; H10B 43/20; H10B 43/30; H10B 43/40; H10B 12/05; H10B 12/03; H10B 12/488; H01L 21/0337; H10D 30/031; H10D 30/6735
See application file for complete search history.

(56) References Cited

U.S. PATENT DOCUMENTS

| | | | |
|---|---|---|---|
| 11,871,558 B2 * | 1/2024 | Son ...................... | H10B 12/482 |
| 2021/0183862 A1 | 6/2021 | Son et al. | |
| 2022/0173106 A1 | 6/2022 | Choi et al. | |

* cited by examiner

*Primary Examiner* — David Vu
(74) *Attorney, Agent, or Firm* — IP & T GROUP LLP

(57) ABSTRACT

A method for fabricating a semiconductor device includes: forming a stack body including first sacrificial layer structures, preliminary horizontal layers, and second sacrificial layer structures over a lower structure; forming a main hard mask layer over the stack body; forming a mesh-shaped hard mask pattern over the main hard mask layer; forming a main hard mask pattern by etching the main hard mask layer using the mesh-shaped hard mask pattern as an etch barrier; forming a plurality of isolation openings by etching the stack body using the main hard mask pattern as an etch barrier; and forming a plurality of isolation layers that fill the isolation openings.

17 Claims, 23 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2023-0046839, filed on Apr. 10, 2023, which is incorporated herein by reference in its entirety.

BACKGROUND

1. Field

Various embodiments of the present invention relate to a semiconductor device, and more particularly, to a semiconductor device including three-dimensional memory cells, and a method for fabricating the semiconductor device.

2. Description of the Related Art

To satisfy recent market demand for larger capacity and more miniaturization of memory devices, various three-dimensional ("3-D") memory devices including memory cells that are stacked in three dimensions are being suggested.

SUMMARY

Embodiments of the present invention are directed to a semiconductor device including a highly integrated 3-D array of memory cells, and a method for fabricating the same.

In accordance with an embodiment of the present invention, a method for fabricating a semiconductor device includes: forming a stack body including first sacrificial layer structures, preliminary horizontal layers, and second sacrificial layer structures over a lower structure; forming a main hard mask layer over the stack body; forming a mesh-shaped hard mask pattern over the main hard mask layer; forming a main hard mask pattern by etching the main hard mask layer using the mesh-shaped hard mask pattern as an etch barrier; forming a plurality of isolation openings by etching the stack body using the main hard mask pattern as an etch barrier; and forming a plurality of isolation layers that fill the isolation openings.

In accordance with another embodiment of the present invention, a method for fabricating a semiconductor device includes: forming an etch target layer including silicon germanium layers and monocrystalline silicon layers over a lower structure; forming a main hard mask layer over the etch target layer; forming a multi-level hard mask layer over the main hard mask layer; forming a mesh-shaped hard mask pattern by performing a double patterning process on the multi-level hard mask layer; forming a main hard mask pattern by etching the main hard mask layer using the mesh-shaped hard mask pattern as an etch barrier; forming a plurality of small openings and a plurality of large openings by etching the etch target layer using the main hard mask pattern as an etch barrier; and forming a plurality of dielectric layers that fill the small openings and the large openings.

In accordance with another embodiment of the present invention, a semiconductor device includes: a plurality of bit lines vertically oriented in a first direction over a lower structure; semiconductor layer patterns horizontally oriented in a second direction from the bit lines; gate dielectric layers suitable for fully covering upper and lower surfaces of each of the semiconductor layer patterns; word lines horizontally oriented in a third direction crossing each of the semiconductor layer patterns over the gate dielectric layers; data storage elements coupled to the semiconductor layer patterns, respectively; first isolation layers vertically oriented in the first direction between the bit lines; and second isolation layers vertically oriented in the first direction between the data storage elements. The first isolation layers have shorter lengths in the second direction than the second isolation layers. The first isolation layers and the second isolation layers are alternately disposed in the second direction. The word lines are horizontally oriented in the third direction between the first isolation layers and the second isolation layers. Each of the word lines includes double word lines facing each other with the semiconductor layer patterns interposed therebetween.

These and other features and advantages of the present invention will become better understood from the following figures and detailed description.

BRIEF DESCRIPTION OF THE DRAWINGS

FIGS. 2A to 8A are plan views illustrating an example of a method for fabricating a semiconductor device in accordance with other embodiments of the present invention.

FIGS. 2B to 8B are cross-sectional views taken along a line A-A' and a line B-B' shown in FIGS. 2A to 8A.

DETAILED DESCRIPTION

Figure 1A:
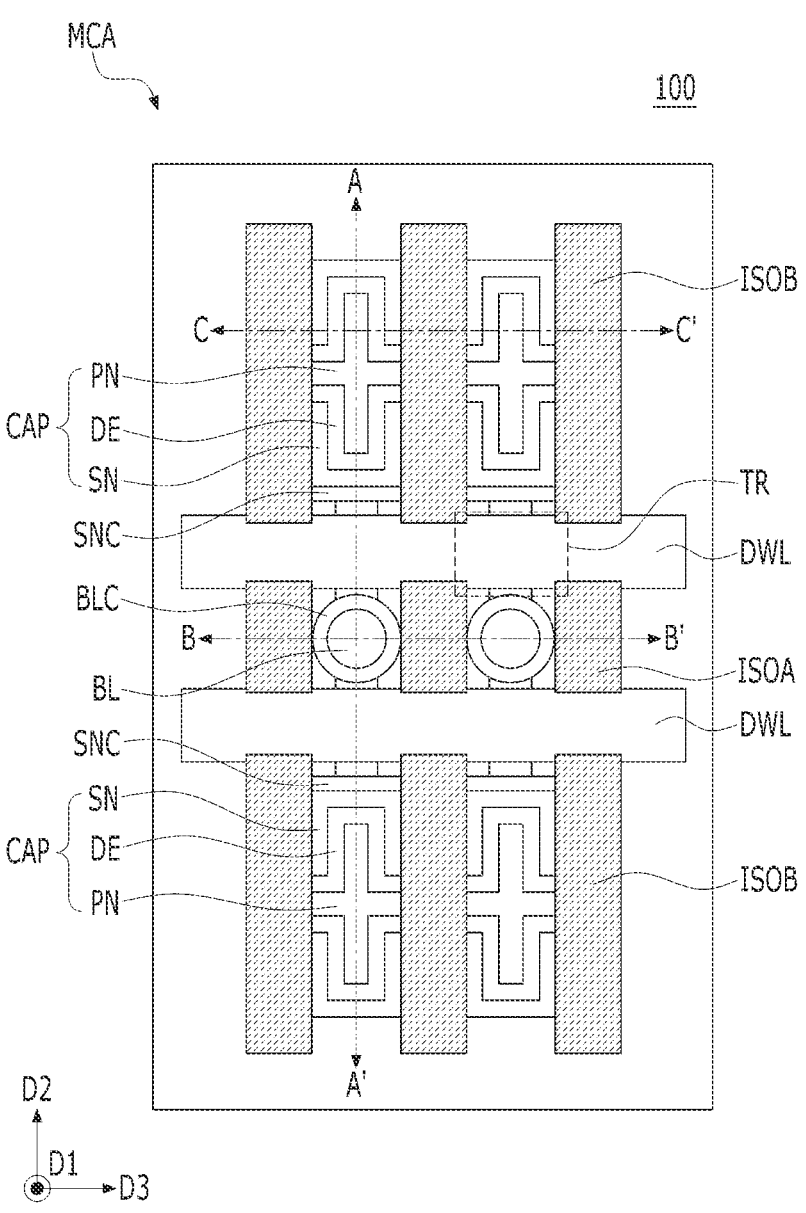
FIG. 1A is a schematic plan view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but it also refers to a case where a third layer exists between the first layer and the second layer or the substrate.

According to an embodiment of the present invention described below, memory cells may be vertically stacked to increase memory cell density and reduce parasitic capacitance.

Figure 1B:
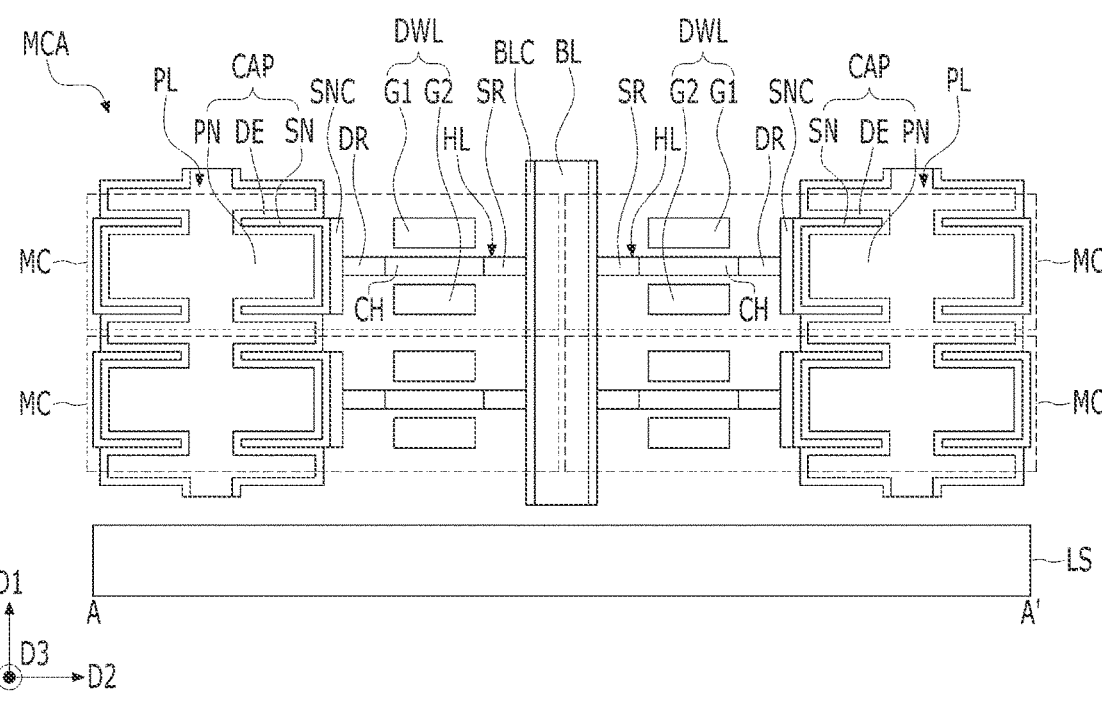
FIG. 1B is a schematic cross-sectional view taken along a line A-A' shown in FIG. 1A.
Figure 1C:
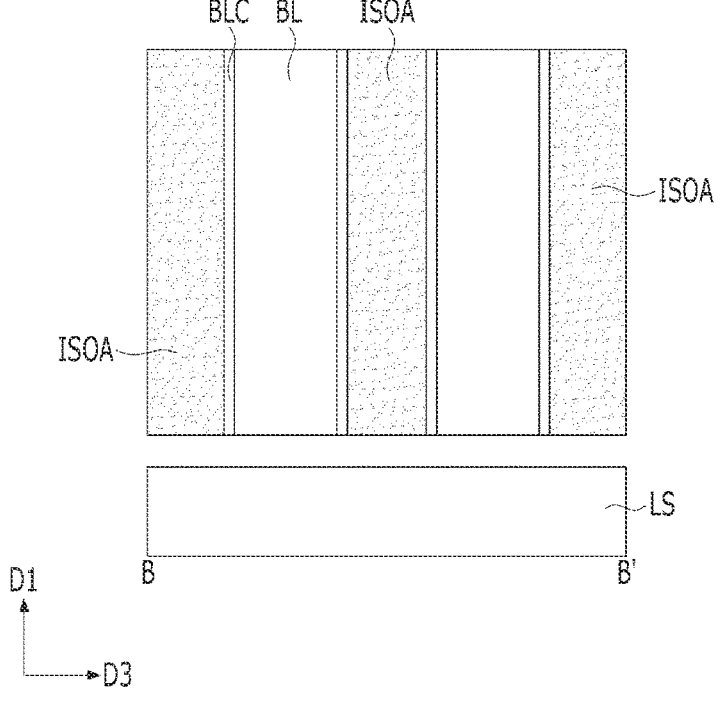
FIG. 1C is a schematic cross-sectional view taken along a line B-B' shown in FIG. 1A.
Figure 1D:
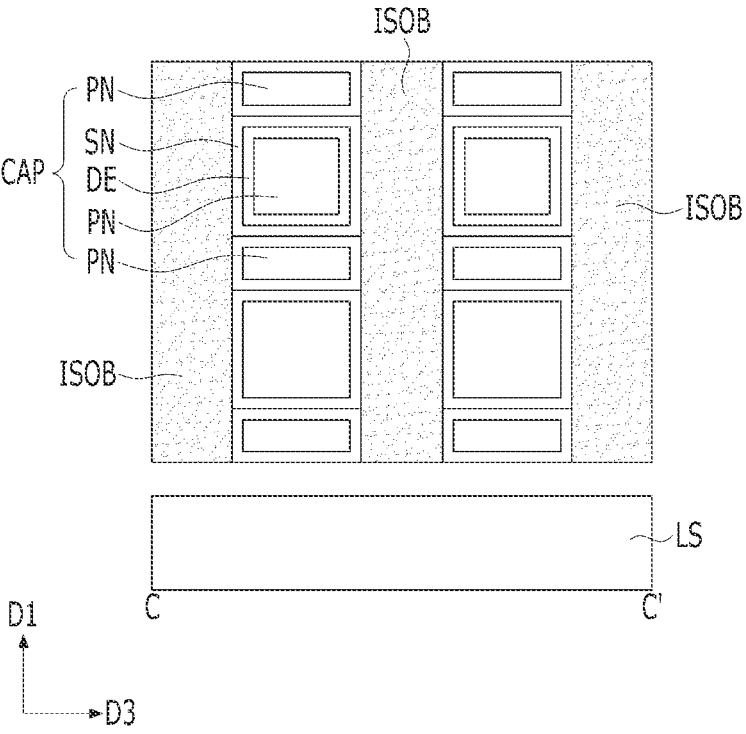
FIG. 1D is a schematic cross-sectional view taken along a line C-C' shown in FIG. 1A.

FIG. 1A is a schematic plan view illustrating a semiconductor device in accordance with an embodiment of the present invention. FIG. 1B is a schematic cross-sectional view taken along a line A-A' shown in FIG. 1A. FIG. 1C is a schematic cross-sectional view taken along a line B-B' shown in FIG. 1A. FIG. 1D is a schematic cross-sectional view taken along a line C-C' shown in FIG. 1A.

Referring to FIGS. 1A to 1D, the semiconductor device 100 may include a memory cell array MCA. The memory cell array MCA may include a plurality of memory cells MC. The memory cell array MCA may include a 3-D array of memory cells MC. The 3-D array of memory cells MC may include a column array of memory cells MC and a row array of memory cells MC. The column array of memory cells MC may have a plurality of memory cells MC that are stacked in a first direction D1. The row array of memory cells MC may have a plurality of memory cells MC that are horizontally disposed in a second direction D2 and a third direction D3. According to some embodiments of the present invention, cell dielectric layers may be disposed between the memory cells MC that are stacked in the first direction D1. Isolation layers ISOA and ISOB may be disposed between the neighboring memory cells MC in the third direction D3. The isolation layers ISOA and ISOB may include a first isolation layer ISOA and a second isolation layer ISOB. The first isolation layer ISOA and the second isolation layer ISOB may include silicon oxide, silicon nitride, silicon carbon oxide (SiCO), or a combination thereof. The first isolation layer ISOA may be disposed between the vertical conductive lines BL in the third direction D3. The second isolation layer ISOB may be disposed between the data storage elements CAP in the third direction D3.

The memory cell array MCA may be disposed over a lower structure LS. The lower structure LS may include a semiconductor substrate. The lower structure LS may include a peripheral circuit portion. The peripheral circuit portion of the lower structure LS may be disposed at a lower level than the memory cell array MCA and may be referred to as a COP (Cell-Over-Peripheral) structure. The peripheral circuit portion may include at least one control circuit for driving the memory cell array MCA. The at least one control circuit of the peripheral circuit portion may include an N-channel transistor, a P-channel transistor, a CMOS circuit, or a combination thereof. The at least one control circuit of the peripheral circuit portion may include an address decoder circuit, a read circuit, a write circuit, and the like. The at least one control circuit of the peripheral circuit portion may include a planar channel transistor, a recess channel transistor, a buried gate transistor, a fin channel transistor (FinFET), and the like.

For example, the peripheral circuit portion may include sub-word line drivers and a sense amplifier. The horizontal conductive lines DWL may be coupled to the sub-word line drivers. The vertical conductive line BL may be coupled to the sense amplifier.

According to another embodiment of the present invention, the peripheral circuit portion may be disposed at a higher level than the memory cell array MCA. This configuration may be referred to as a POC (Peripheral-Over-Cell) structure.

The memory cell array MCA may include horizontal conductive lines DWL that are stacked in the first direction D1. Each of the horizontal conductive lines DWL may include a pair of a first horizontal conductive line G1 and a second horizontal conductive line G2.

According to another embodiment of the present invention, the semiconductor device 100 may include a mirror-type structure sharing a common plate PL.

Each memory cell MC may include a vertical conductive line BL, a switching element TR, and a data storage element CAP.

The switching element TR may include a horizontal layer HL, a gate dielectric layer GD, and a horizontal conductive line DWL. The data storage element CAP may include a memory element, such as a capacitor. The vertical conductive line BL may include a bit line. The horizontal conductive line DWL may include a word line, and the horizontal layer HL may include an active layer. The data storage element CAP may include a first electrode SN, a dielectric layer DE, and a second electrode PN. The switching element TR may include a transistor, and in this case, the horizontal conductive line DWL may serve as a gate electrode. The switching element TR may also be referred to as an access element or a select element.

The memory cell array MCA may include a plurality of horizontal conductive lines DWL that are vertically stacked in the first direction D1. The memory cell array MCA may include a plurality of horizontal layers HL that are vertically stacked in the first direction D1. The memory cell array MCA may include a plurality of data storage elements CAP that are vertically stacked in the first direction D1.

The vertical conductive line BL may extend vertically from the top of the lower structure LS in the first direction D1. The horizontal layer HL may extend in the second direction D2 crossing the first direction D1. The horizontal conductive line DWL may extend in the third direction D3 crossing the first and second directions D1 and D2. The first, second, and third directions D1, D2 and D3 may be orthogonal to each other.

The vertical conductive line BL may be vertically oriented in the first direction D1. The vertical conductive line BL may be referred to as a vertically oriented bit line, vertically extended bit line, or a pillar-shape bit line. The vertical conductive line BL may include a conductive material. The vertical conductive line BL may include a silicon-based material, a metal-based material, or a combination thereof. The vertical conductive line BL may include polysilicon, a metal, a metal nitride, a metal silicide, or a combination thereof. The vertical conductive line BL may include polysilicon, titanium nitride, tungsten, or a combination thereof. For example, the vertical conductive line BL may include polysilicon or titanium nitride (TiN) which is doped with an N-type impurity. The vertical conductive line BL may include a TiN/W stack of titanium nitride and tungsten. The vertical conductive lines BL of the memory cells MC that are disposed adjacent to each other in the third direction D3 may be isolated from each other by the first isolation layer ISOA.

The switching element TR may include a transistor, and thus, the horizontal conductive line DWL may be referred to as a horizontal gate line or a horizontal word line.

The horizontal conductive line DWL may extend in the third direction D3, and the horizontal layer HL may extend in the second direction D2. The horizontal layer HL may be horizontally arranged from the vertical conductive line BL. The horizontal conductive line DWL may have a double structure. For example, the horizontal conductive line DWL may include first and second horizontal conductive lines G1 and G2 that are facing each other with the horizontal layer HL interposed therebetween. A gate dielectric layer GD may be formed on the upper and lower surfaces of the horizontal layer HL. The first horizontal conductive line G1 may be disposed over the horizontal layer HL, and the second horizontal conductive line G2 may be disposed below the horizontal layer HL. The horizontal conductive line DWL may include a pair of a first horizontal conductive line G1 and a second horizontal conductive line G2. In the horizontal conductive line DWL, the first horizontal conductive line G1 and the second horizontal conductive line G2 may have the same potential. For example, the first horizontal conductive line G1 and the second horizontal conductive line G2 may form a pair and may be included in one memory cell MC. The same driving voltage may be applied to the first horizontal conductive line G1 and the second horizontal conductive line G2.

The horizontal layer HL may extend in the second direction D2 and may include a semiconductor material. For example, the horizontal layer HL may include polysilicon, monocrystalline silicon, germanium, or silicon germanium. According to another embodiment of the present invention, the horizontal layer HL may include an oxide semiconductor material. For example, the oxide semiconductor material may include indium gallium zinc oxide (IGZO).

The upper and lower surfaces of the horizontal layer HL may have flat surfaces. For example, the upper and lower surfaces of the horizontal layer HL may be parallel to each other in the second direction D2.

The horizontal layer HL may include a channel CH, a first doped region SR between the channel CH and the vertical conductive line BL, and a second doped region DR between the channel CH and the data storage element CAP. When the horizontal layer HL is formed of an oxide semiconductor material, the channel CH may be formed of an oxide semiconductor material, and the first and second doped regions SR and DR may be omitted. The horizontal layer HL may also be referred to as an active layer or a thin-body.

The first doped region SR and the second doped region DR may be doped with impurities of the same conductivity type. The first doped region SR and the second doped region DR may be doped with an N-type impurity or a P-type impurity. The first doped region SR and the second doped region DR may include at least one impurity selected among arsenic (As), phosphorus (P), boron (B), indium (In), and a combination thereof. The first doped region SR may be coupled to the vertical conductive line BL, and the second doped region DR may be coupled to a first electrode SN of the data storage element CAP.

The gate dielectric layer GD may include silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSiO, HfSiON, or a combination thereof.

The gate dielectric layer GD may have a shape that fully covers a first surface (or upper surface) and a second surface (or lower surface) of the horizontal layer HL. The length of the gate dielectric layer GD in the second direction D2 may be the same as the length of the horizontal layer HL. The first and second surfaces of the horizontal layer HL may be flat surfaces.

The horizontal conductive line DWL may include a metal-based material, a semiconductor material, or a combination thereof. The horizontal conductive line DWL may include titanium nitride, tungsten, polysilicon, or a combination thereof. For example, the horizontal conductive line DWL may include a TiN/W stack in which titanium nitride and tungsten are sequentially stacked. The horizontal conductive line DWL may include an N-type work function material or a P-type work function material. The N-type work function material may have a low work function of approximately 4.5 eV or less, and the P-type work function material may have a high work function of approximately 4.5 eV or more.

The data storage element CAP may be horizontally disposed in the second direction D2 from the switching element TR. The data storage element CAP may include a first electrode SN extending horizontally from the horizontal layer HL in the second direction D2. The data storage element CAP may further include a second electrode PN over the first electrode SN, and a dielectric layer DE between the first electrode SN and the second electrode PN. The first electrode SN, the dielectric layer DE, and the second electrode PN may be horizontally arranged in the second direction D2. The first electrode SN may have a horizontally oriented cylinder-shape. The dielectric layer DE may conformally cover the inner wall and the outer wall of the cylinder of the first electrode SN. The second electrode PN may cover the inner wall and the outer wall of the cylinder of the first electrode SN over the dielectric layer DE. The first electrode SN may be electrically connected to the second doped region DR.

The first electrode SN may have a three-dimensional structure, and the first electrode SN of the three-dimensional structure may have a horizontal three-dimensional structure which is oriented in the second direction D2. As an example of the 3-D structure, the first electrode SN may have a cylinder shape. According to another embodiment of the present invention, the first electrode SN may have a pillar shape or a pylinder shape. The pylinder shape may refer to a structure in which a pillar shape and a cylinder shape are merged.

The first electrode SN and the second electrode PN may include a metal, a noble metal, a metal nitride, a conductive metal oxide, a conductive noble metal oxide, a metal carbide, a metal silicide, or a combination thereof. For example, the first electrode SN and the second electrode PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack. The second electrode PN may include a combination of a metal-based material and a silicon-based material. For example, the second electrode PN may be a stack of titanium nitride/silicon germanium/tungsten nitride (TIN/SiGe/WN). In the titanium nitride/silicon germanium/tungsten nitride (TiN/SiGe/WN) stack, silicon germanium may be a gap-fill material filling the cylindrical inside of the first electrode SN, titanium nitride (TIN) may serve as the second electrode PN of the data storage element CAP, and tungsten nitride may be a low-resistance material.

The dielectric layer DE may be referred to as a capacitor dielectric layer or a memory layer. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including hafnium oxide ($HfO_2$). The dielectric layer DE may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). As a result, the dielectric layer DE may include a stack of a high-k material and a high-bandgap material having a greater bandgap energy than the high-k material. The dielectric layer DE may include silicon oxide ($SiO_2$) as a high bandgap material other than aluminum oxide ($Al_2O_3$). Since the dielectric layer DE may include a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure including zirconium oxide, hafnium oxide, and aluminum oxide, a laminated structure including zirconium oxide, hafnium oxide, and aluminum oxide, or a mixed structure including zirconium oxide, hafnium oxide, and aluminum oxide.

According to another embodiment of the present invention, an interface control layer for improving leakage current may be further formed between the first electrode SN and the dielectric layer DE. The interface control layer may include titanium oxide ($TiO_2$), tantalum oxide ($Ta_2O_5$), or niobium oxide ($Nb_2O_5$). The interface control layer may also be formed between the second electrode PN and the dielectric layer DE.

The data storage element CAP may include a metal-insulator-metal (MIM) capacitor. The first electrode SN and the second electrode PN may include a metal-based material.

The data storage element CAP may be replaced with another data storage material. For example, the data storage material may be a phase change material, a magnetic tunnel junction (MTJ), or a variable resistance material.

The memory cell MC may further include a first contact node BLC between the vertical conductive line BL and the horizontal layer HL, and a second contact node SNC between the horizontal layer HL and the data storage element CAP. The first and second contact nodes BLC and SNC may include doped polysilicon. The first doped region SR and the second doped region DR may include an impurity diffused from the first and second contact nodes BLC and SNC, respectively. The first contact node BLC may surround the outer wall of the vertical conductive line BL.

Cell dielectric layers may be disposed between the memory cells MC that are stacked in the first direction D1. Isolation layers ISOA and ISOB may be disposed between the neighboring memory cells MC in the third direction D3. Second electrodes PN of the neighboring data storage elements CAP in the first direction D1 may be coupled to each other.

The second electrodes PN of the data storage elements CAP may be coupled to a common plate PL. The horizontal layers HL of the switching elements TR disposed horizontally in the third direction D3 may share one horizontal conductive line DWL. The horizontal layers HL of the switching elements TR disposed horizontally in the third direction D3 may be coupled to different vertical conductive lines BL. The switching elements TR stacked in the first direction D1 may share one vertical conductive line BL. The switching elements TR disposed horizontally in the third direction D3 may share one horizontal conductive line DWL.

FIGS. 2A to 8A are plan views illustrating an example of a method for fabricating a semiconductor device in accordance with other embodiments of the present invention. FIGS. 2B to 8B are cross-sectional views taken along a line A-A' and a line B-B' shown in FIGS. 2A to 8A.

Figure 2A:
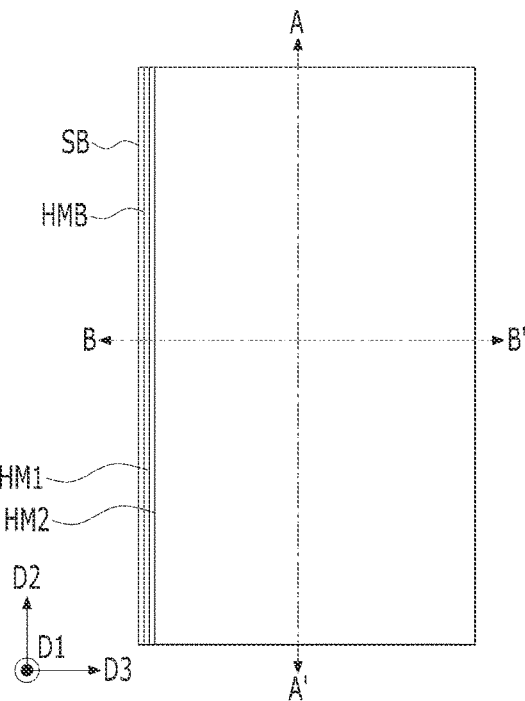
Figure 2B:
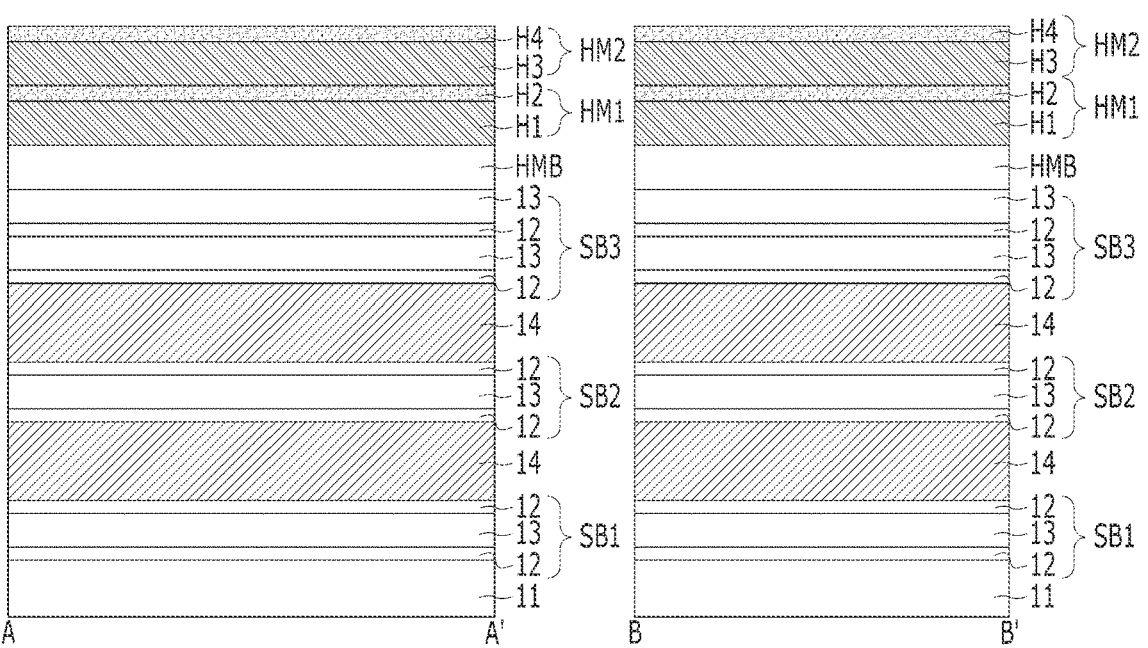

Referring to FIGS. 2A and 2B, an etch target layer may be formed over a lower structure 11. The etch target layer may include a stack body SB comprising a plurality of sub-stacks SB1, SB2, and SB3. The lower structure 11 may include a semiconductor substrate or a silicon substrate. Each of the first two sub-stacks SB1, and SB2 may include a first sacrificial layer 12, a second sacrificial layer 13, another first sacrificial layer 12, in the mentioned order. A preliminary horizontal layer 14 may be disposed between the consecutive sub-layers SB1 and SB2.

The first sacrificial layers 12 may include silicon germanium, and the second sacrificial layers 13 may include monocrystalline silicon. The preliminary horizontal layer 14 may include monocrystalline silicon. The first sacrificial layer 12, the second sacrificial layer 13, and the preliminary horizontal layer 14 may be formed by epitaxial growth. The first sacrificial layer 12 may be thinner than the second sacrificial layer 13, and the preliminary horizontal layer 14 may be thicker than the second sacrificial layer 13.

The stack body SB may include a first sacrificial layer structure SB1, preliminary horizontal layer 14, a second sacrificial layer structure SB2, another preliminary horizontal layer 14; and a third sacrificial layer structure SB3. In the stack body SB, the first sacrificial layer structure SB1, the preliminary horizontal layer structure 14, the second sacrificial layer structure SB2, the preliminary horizontal layer structure 14, and the third sacrificial layer structure SB3 may be sequentially stacked. For example, the preliminary horizontal layer 14 may be disposed between the first sacrificial layer structure SB1 and the second sacrificial layer structure SB2. The preliminary horizontal layer 14 may also be disposed between the second sacrificial layer structure SB2 and the third sacrificial layer structure SB3.

Each of the first and second sacrificial layer structures SB1 and SB2 may be a triple layer stack of the first sacrificial layer 12/second sacrificial layer 13/first sacrificial layer 12. The third sacrificial layer structure SB3 may be a four-layer stack of the first sacrificial layer 12/second sacrificial layer 13/first sacrificial layer 12/second sacrificial layer 13.

For example, the first sacrificial layer 12 may include a silicon germanium layer. The second sacrificial layer 13 may include a monocrystalline silicon layer. The triple layer stack of each of the first and second sacrificial layer structures SB1 and SB2 may include a first silicon germanium layer/monocrystalline silicon layer/second silicon germanium layer (SiGe/Si/SiGe) stack. The four-layer stack of the third sacrificial layer structure SB3 may include a first silicon germanium layer/monocrystalline silicon layer/second silicon germanium layer/monocrystalline silicon layer (SiGe/Si/SiGe/Si) stack.

The second sacrificial layers 13 may include a first monocrystalline silicon layer, and the preliminary horizontal layers 14 may include a second monocrystalline silicon layer. As a result, in the stack body SB, the first sacrificial layer structure SB1 may be disposed below the second monocrystalline silicon layer 14, and the second sacrificial layer structure SB2 may be disposed over the second monocrystalline silicon layer 14. Each of the first and second sacrificial layer structures SB1 and SB2 may include a first silicon germanium layer/first monocrystalline silicon layer/second silicon germanium layer stack. The second monocrystalline silicon layer 14 may be thicker than the first monocrystalline silicon layer 13.

As described in the foregoing embodiments of the present invention, when memory cells are stacked, the stack body SB may be formed by alternately stacking the first sacrificial layer structure SB1/preliminary horizontal layer 14/second sacrificial layer structure SB2 several times. The third sacrificial layer structure SB3 may be formed only once.

A hard mask structure HM may be formed over the third sacrificial layer structure SB3. The hard mask structure HM may include a stack of a main hard mask layer HMB, a first hard mask layer HM1 and a second hard mask layer HM2. The first hard mask layer HM1 may include a stack of a first layer H1 and a second layer H2. The second hard mask layer HM2 may include a stack of a third layer H3 and a fourth layer H4. The first layer H1 and the third layer H3 may be formed of the same material, and the second layer H2 and the fourth layer H4 may be formed of the same material. The first and third layers H1 and H3 and the second and fourth layers H2 and H4 may be formed of different materials.

The hard mask structure HM, that is, the main hard mask layer HMB, the first hard mask layer HM1, and the second hard mask layer HM2 may include a material having an etch selectivity with respect to the stack body SB.

The hard mask structure HM may include silicon oxide, amorphous carbon, silicon oxynitride (SiON), Spin-On-Carbon (SOC), or a combination thereof. The main hard mask layer HMB may include silicon oxide. The first and third layers H1 and H3 may include amorphous carbon, and the second and fourth layers H2 and H4 may include silicon oxynitride (SiON). For example, the hard mask structure HM may include silicon oxide, amorphous carbon, silicon oxynitride, amorphous carbon, and silicon oxynitride that are stacked in the mentioned order. The main hard mask layer HMB may be thicker than the first and second hard mask layers HM1 and HM2. The first and second hard mask layers HM1 and HM2 may be used as etch barriers for etching the main hard mask layer HMB, and may be removed after etching the main hard mask layer HMB. The main hard mask layer HMB may be used as an etch barrier for etching the stack body SB.

Figure 3A:
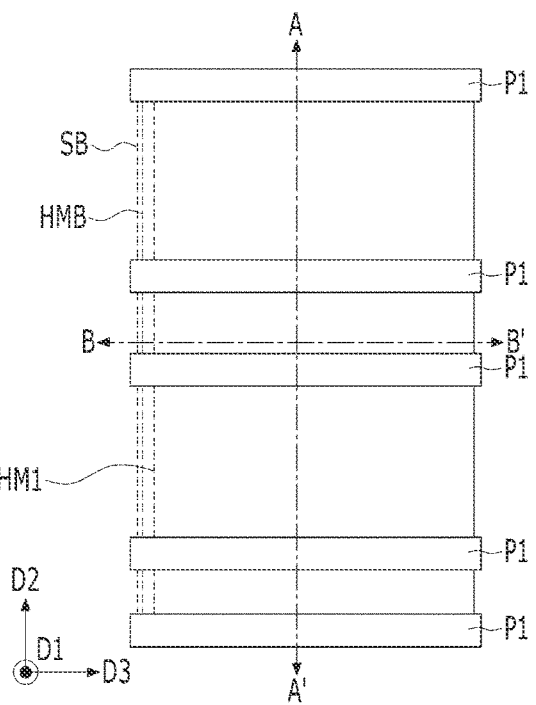
Figure 3B:
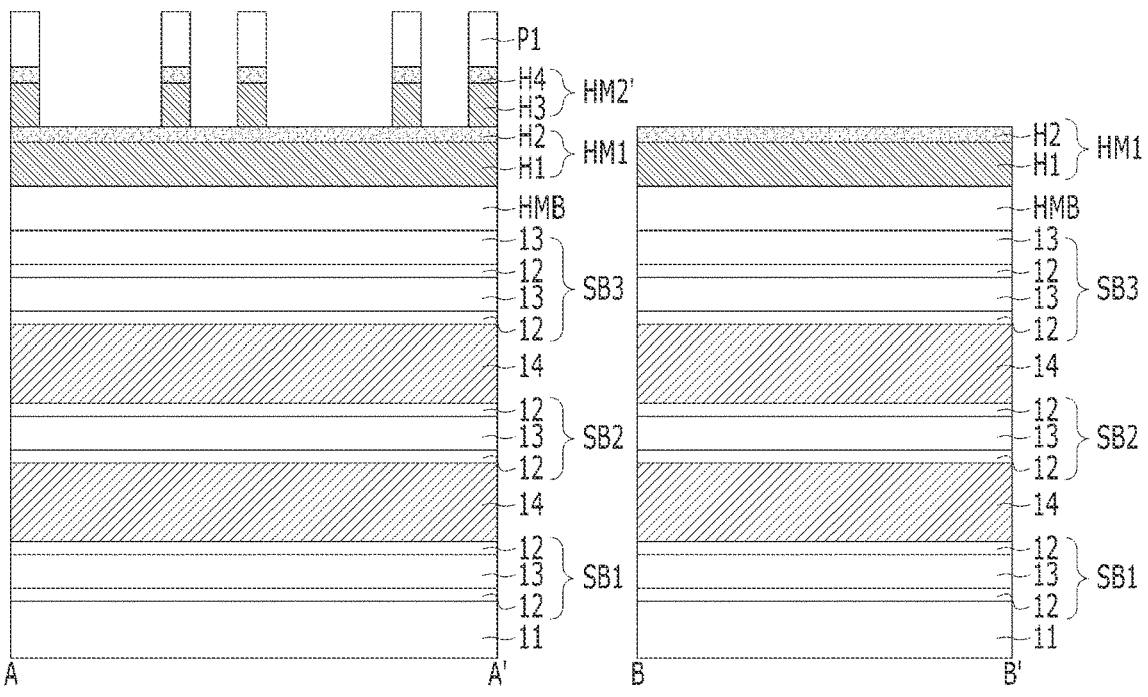

Referring to FIGS. 3A and 3B, a first mask pattern P1 may be formed over the second hard mask layer HM2 of the hard mask structure HM. The first mask pattern P1 may be a line and space pattern. In other words, the first mask pattern P1 may include a plurality of line patterns, and spaces may be defined between the line patterns of the first mask pattern P1. The line patterns and spaces of the first mask pattern P1 may extend in the third direction D3. The first mask pattern P1 may include a photoresist pattern.

Subsequently, the second hard mask layer HM2 may be etched using the first mask pattern P1 as an etch mask. As a result, a second hard mask pattern HM2' may be formed. The second hard mask pattern HM2' may be a line and space pattern. In other words, the second hard mask pattern HM2' may include a plurality of line patterns, and spaces 21 may be defined between the line patterns of the second hard mask pattern HM2'. The second hard mask pattern HM2' may include a stack of a third layer H3 and a fourth layer H4. The second hard mask pattern HM2' may include a stack of amorphous carbon and silicon oxynitride.

Figure 4A:
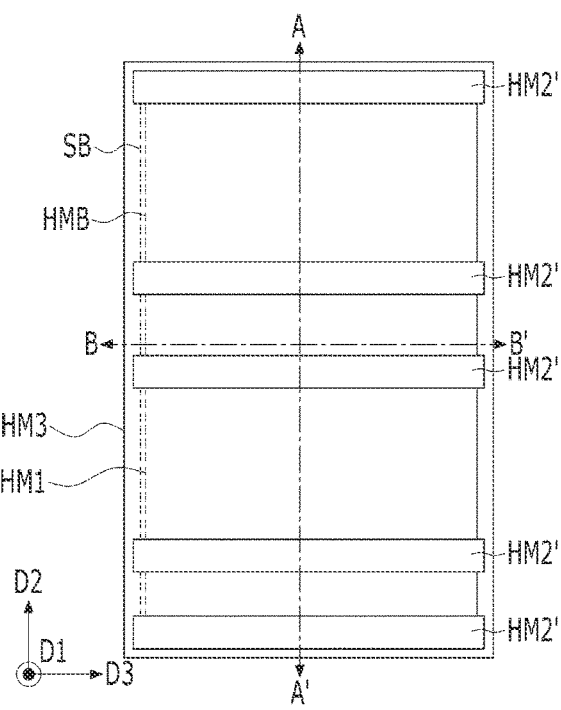
Figure 4B:
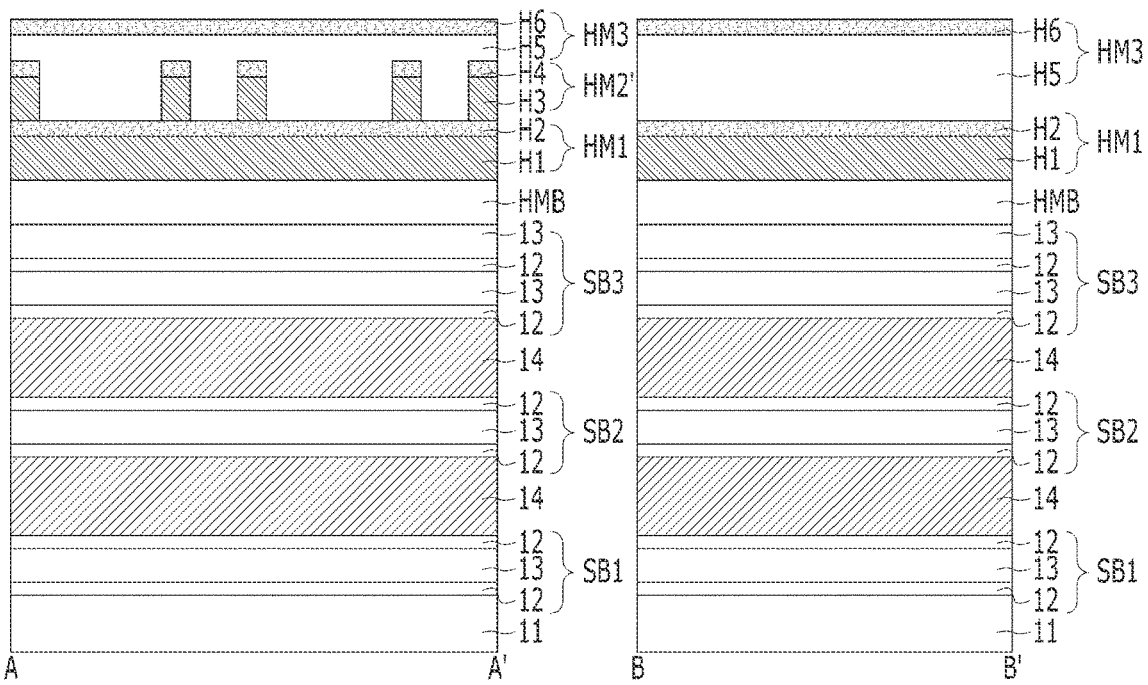

Referring to FIGS. 4A and 4B, after the first mask pattern P1 is removed, a third hard mask layer HM3 may be formed over the second hard mask pattern HM2'. The third hard mask layer HM3 may include a stack of a fifth layer H5 and a sixth layer H6. The fifth layer H5 may include spin-on-carbon (SOC), and the sixth layer H6 may include silicon oxynitride.

Figure 5A:
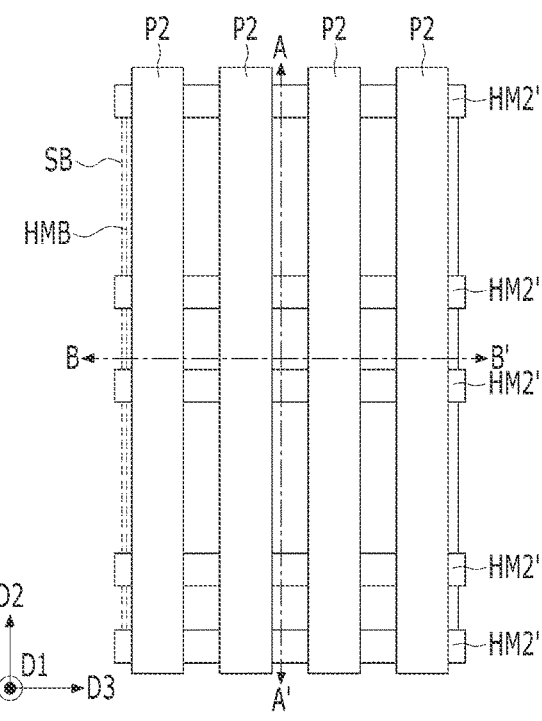
Figure 5B:
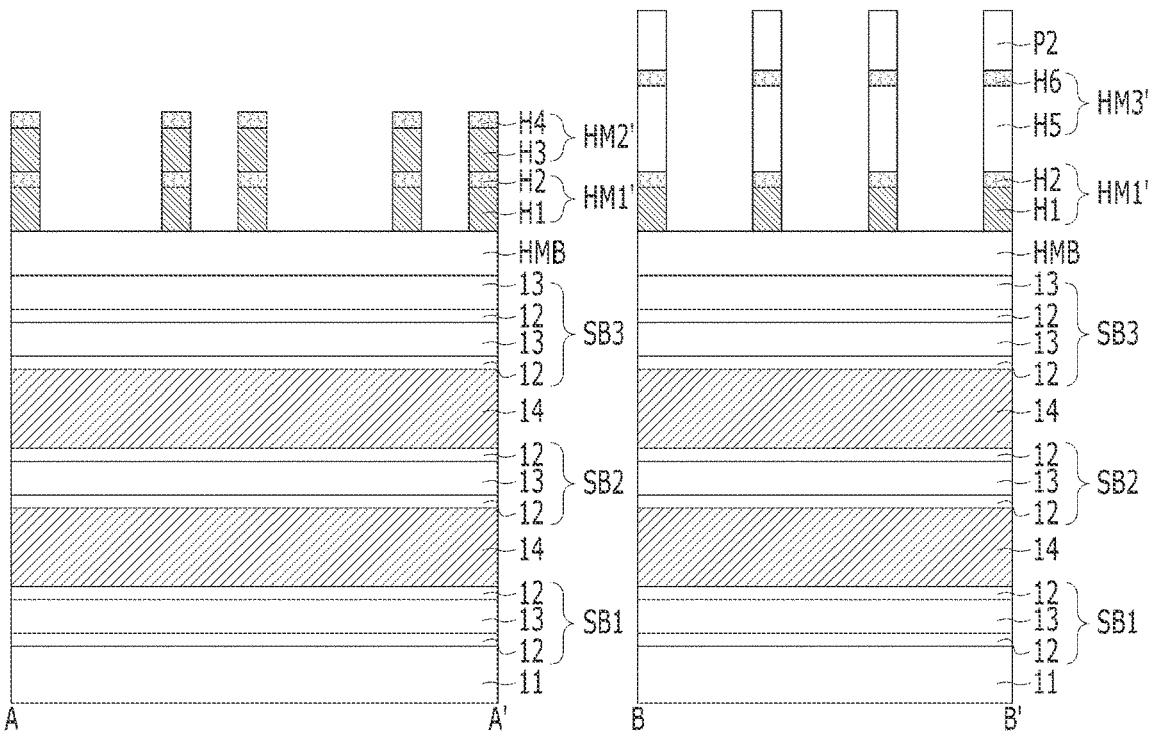

Referring to FIGS. 5A and 5B, a second mask pattern P2 may be formed over the third hard mask layer HM3. The second mask pattern P2 may be a line and space pattern. In other words, the second mask pattern P2 may include a plurality of line patterns, and spaces may be defined between the line patterns of the second mask pattern P2. The line patterns and spaces of the second mask pattern P2 may extend in the second direction D2. The second mask pattern 24 and the first mask pattern P1 may cross each other. The second mask pattern P2 may include a photoresist pattern.

Subsequently, the third hard mask layer HM3 may be etched using the second mask pattern P2 as an etch mask. As a result, a third hard mask pattern HM3' may be formed. The third hard mask pattern HM3' may be a line and space pattern. In other words, the third hard mask pattern HM3' may include a plurality of line patterns, and spaces may be defined between the line patterns of the third hard mask pattern HM3'. The third hard mask pattern HM3' may include a stack of the fifth layer H5 and the sixth layer H6. The third hard mask pattern HM3' may include a stack of spin-on-carbon and silicon oxynitride.

The third hard mask pattern HM3' may be formed in the section B-B', and all of the third hard mask layer HM3 may be etched in the section A-A'.

Subsequently, the first hard mask layer HM1 may be etched using the second mask pattern P2, the third hard mask pattern HM3', and the second hard mask pattern HM2' as an etch barrier. As a result, a first hard mask pattern HM1' may be formed. The first hard mask pattern HM1' may be a line and space pattern. In other words, the first hard mask pattern HM1' may include a plurality of line patterns, and spaces may be defined between the line patterns of the first hard mask pattern HM1'. The first hard mask pattern HM1' may include a stack of a first layer H1 and a second layer H2. The first hard mask pattern HM1' may include a stack of amorphous carbon and silicon oxynitride.

Figure 6A:
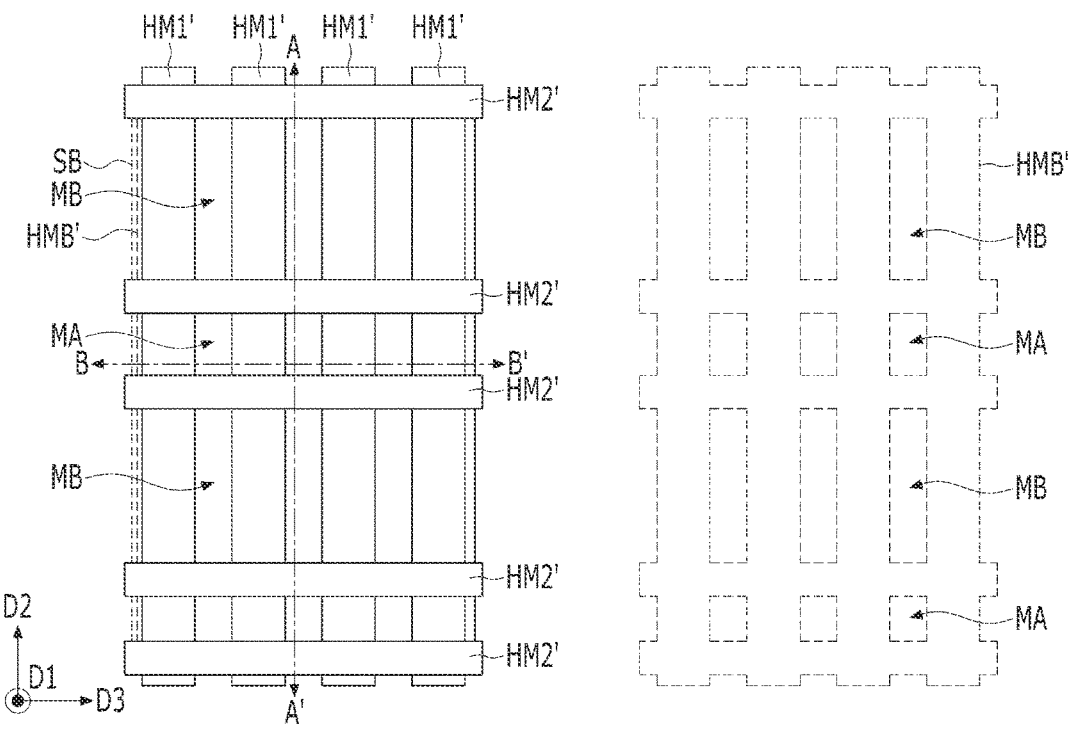
Figure 6B:
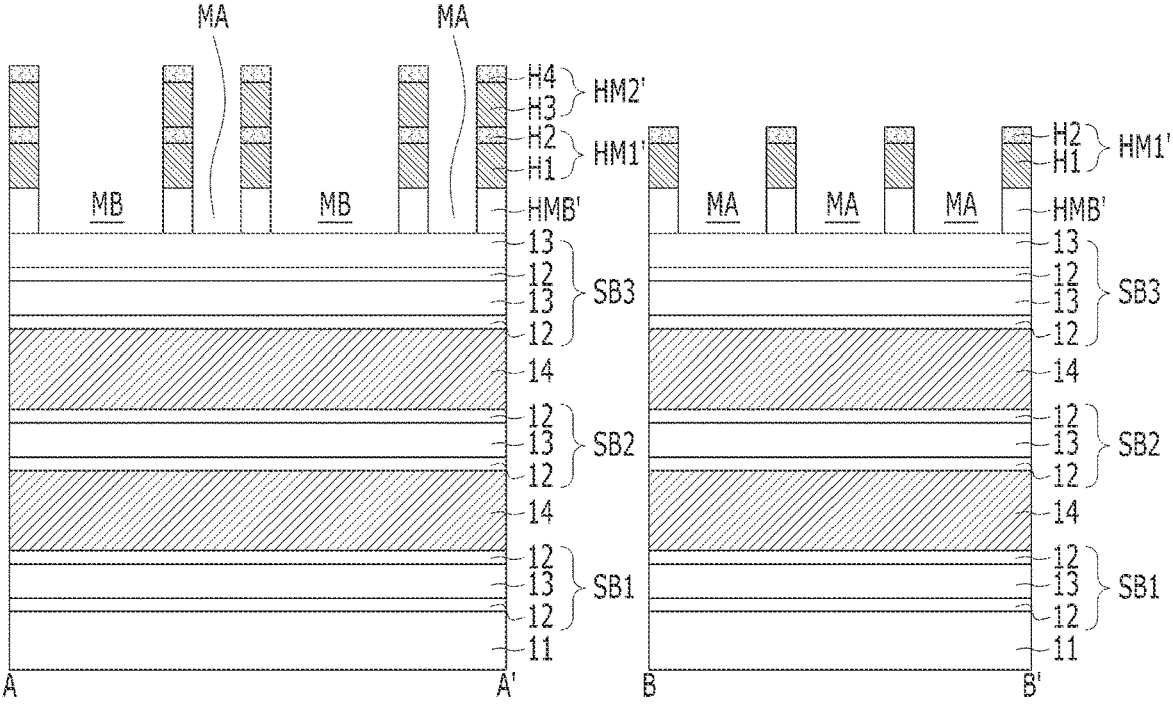

Referring to FIGS. 6A and 6B, the second mask pattern P2 and the third hard mask pattern HM3' may be removed.

From the perspective of a top view, the first hard mask pattern HM1' may include line patterns extending in the first direction. The second hard mask pattern HM2' may include line patterns extending in the second direction. The first hard mask pattern HM1' and the second hard mask pattern HM2' may cross each other, and thus the combination of the first hard mask pattern HM1' and the second hard mask pattern HM2' may form a mesh structure.

Subsequently, the main hard mask layer HMB may be etched using the second hard mask pattern HM2' and the first hard mask pattern HM1' as an etch barrier. As a result, a main hard mask pattern HMB' may be formed, and the main hard mask pattern HMB' may include a plurality of first and second preliminary isolation openings MA and MB. Since the first and second hard mask patterns HM1' and HM2' providing a mesh structure are used as etch barriers, the critical dimension uniformity of the first preliminary isolation openings MA and the second preliminary isolation openings MB may be improved.

Figure 7A:
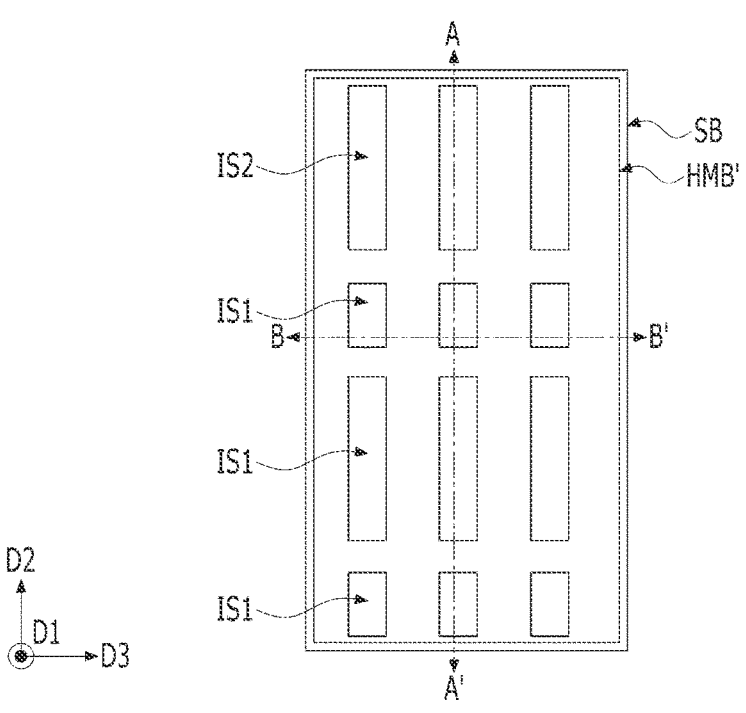
Figure 7B:
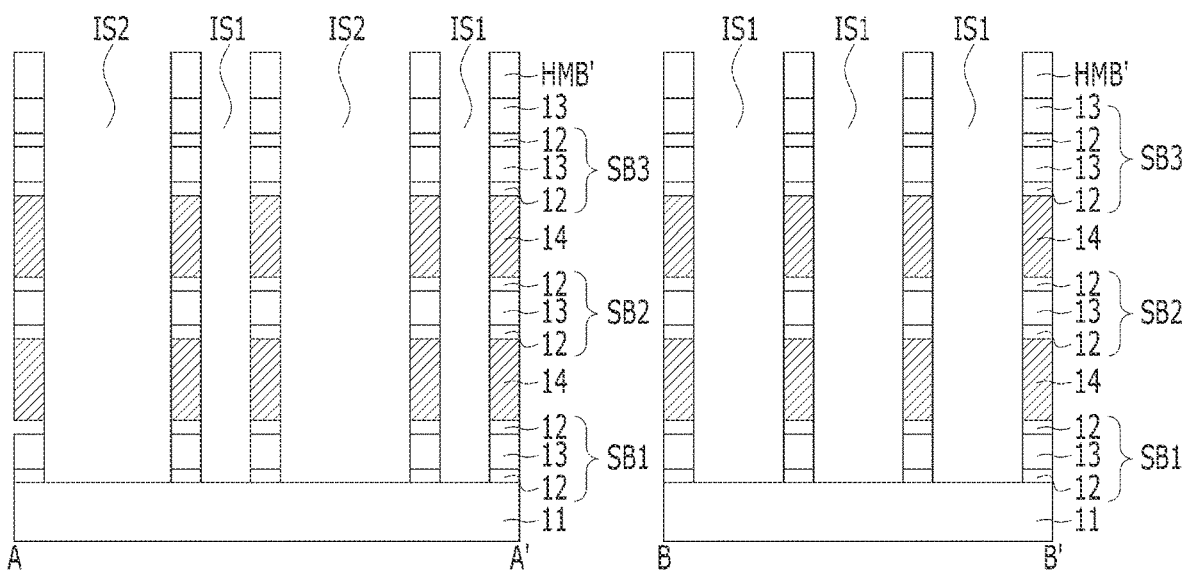

Referring to FIGS. 7A and 7B, a portion of the stack body SB may be etched using the main hard mask pattern HMB' as an etch barrier. As a result, a plurality of isolation openings IS1 and IS2 may be formed. The isolation openings IS1 and IS2 may include first isolation openings IS1 and second isolation openings IS2. The first isolation openings IS1 may have a smaller size than the second isolation openings IS2. The first isolation openings IS1 may be referred to as small isolation openings, and the second isolation openings IS2 may be referred to as large isolation openings.

Figure 8A:
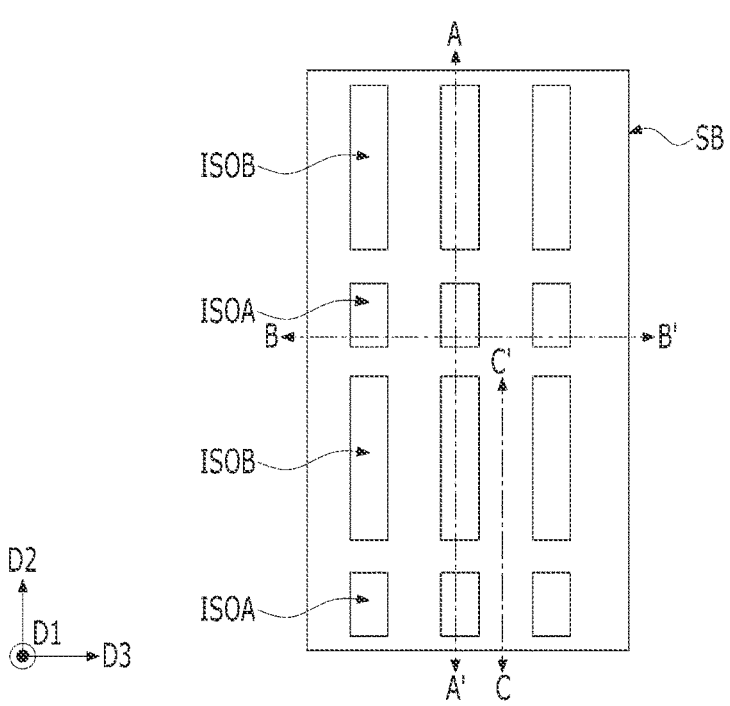
Figure 8B:
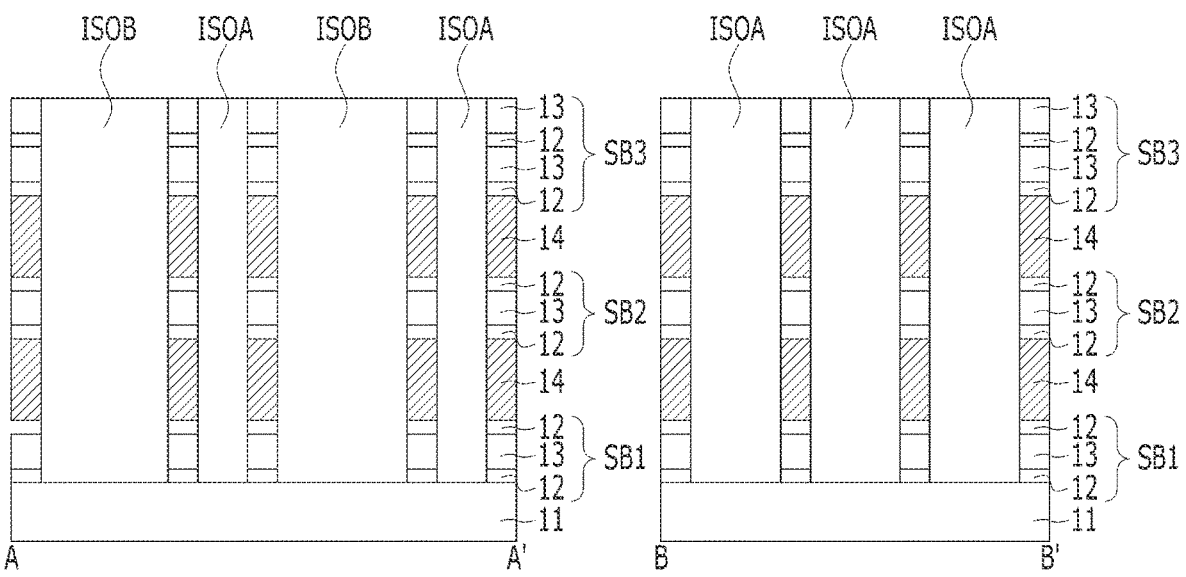

Referring to FIGS. 8A and 8B, first and second isolation layers ISOA and ISOB filling the first and second isolation openings IS1 and IS2 may be formed. The first and second isolation layers ISOA and ISOB may be formed by depositing a dielectric material and performing a planarization process. During a planarization process for forming the first and second isolation layers ISOA and ISOB, the main hard mask pattern HMB' may be removed. The first and second isolation layers ISOA and ISOB may include silicon oxide, silicon nitride, silicon carbon oxide, or a combination thereof. The first isolation layers ISOA may be referred to as small isolation layers, and the second isolation layers ISOB may be referred to as large isolation layers. The first isolation layers ISOA and the second isolation layers ISOB may be alternately disposed in the second direction D2.

According to FIGS. 2A to 8B, a multi-patterning process may be applied to form the main hard mask pattern HMB'. The multi-patterning process may include a first patterning process for forming a second hard mask pattern HM2', a second patterning process for forming a first hard mask pattern HM1', and a third patterning process for forming the main hard mask pattern HMB'. The first patterning process may use the first mask pattern P1, and the second patterning process may use the second mask pattern P2, and the third patterning process may use a mesh-shaped pattern provided by a combination of the second hard mask pattern HM2' and the first the hard mask patterns HM1'. The main hard mask pattern HMB' may be formed through a multi-patterning process, and the stack body SB may be etched using the main hard mask pattern HMB'.

As a result, in order to form the small-size first isolation openings IS1 and the large-size second isolation openings IS2, the mesh-shaped main hard mask pattern HMB' may be used as an etch barrier. Since the mesh-shaped pattern is used as the etch barrier, critical dimension uniformity of the first isolation openings IS1 and the second isolation openings IS2 may be improved.

As a comparative example, a single patterning process may be performed to form a plurality of first and second preliminary isolation openings MA and MB in the main hard mask pattern HMB'. The single patterning process may refer to a process of etching the main hard mask pattern by using one mask pattern. In the case of using the single patterning process, critical dimension uniformity of the first preliminary isolation openings and the second preliminary isolation openings may be deteriorated.

FIGS. 9 to 29 illustrate an example of a method for fabricating a memory cell array MCA shown in FIGS. 1A to 1D. FIGS. 9 to 29 illustrate a method for fabricating a semiconductor device taken along a line C-C' shown in FIG. 8A.

Figure 9:
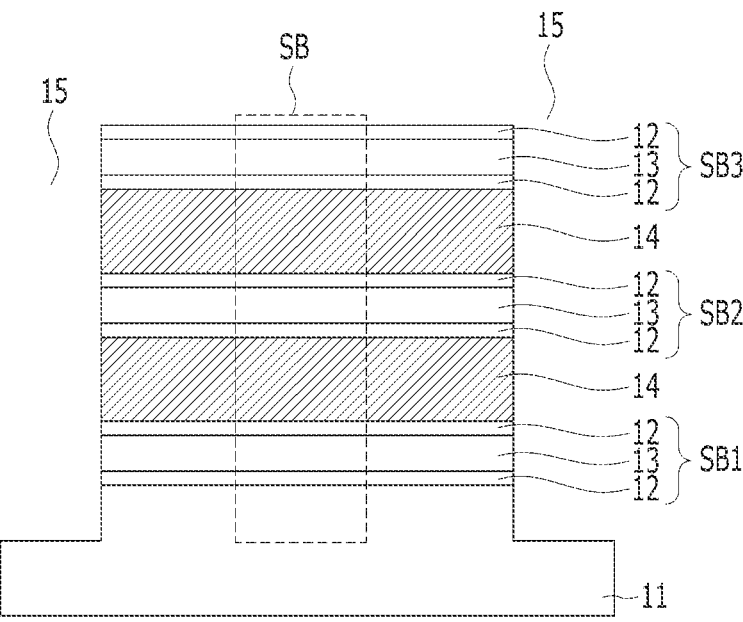
FIGS. 9 to 29 illustrate an example of a method for fabricating a semiconductor device in accordance with other embodiments of the present invention.

Referring to FIG. 9, first openings 15 may be formed by etching a portion of the stack body SB. The first openings 15 may extend vertically from the surface of the lower structure 11. Before the first openings 15 are formed, the stack body SB may be patterned on the basis of an individual memory cell.

Figure 10:
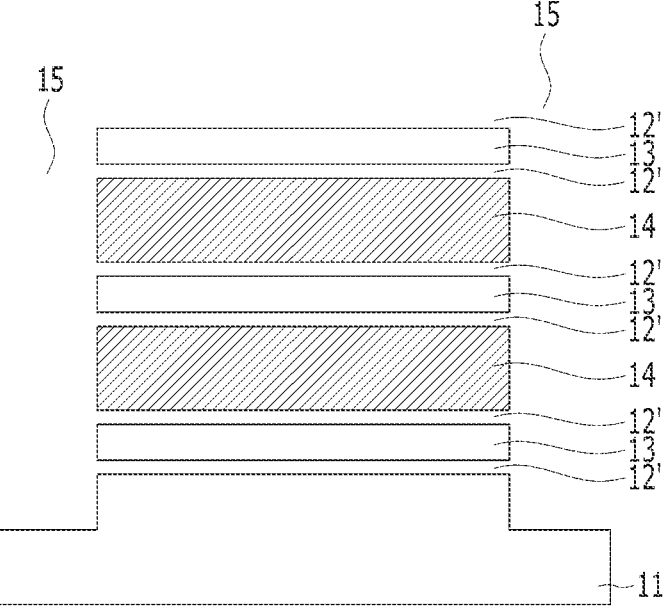

Referring to FIG. 10, a plurality of initial horizontal recesses 12' may be formed between the second sacrificial layers 13 and the preliminary horizontal layers 14. To form the initial horizontal recesses 12', the first sacrificial layers 12 may be selectively removed through the first openings 15. The initial horizontal recesses 12' may have the same size, e.g., the same height.

In order to selectively remove the first sacrificial layers 12, the difference in etch selectivity between the second sacrificial layers 13 and the preliminary horizontal layers 14 and the first sacrificial layers 12 may be used. The first sacrificial layers 12 may be removed by using a wet etching process or a dry etching process. For example, when the first sacrificial layers 12 include a silicon germanium layer and the second sacrificial layers 13 and the preliminary horizontal layers 14 include a silicon layer, the silicon germanium layers may be etched using an etchant or an etch gas having the etch selectivity with respect to the silicon layers.

Figure 11:
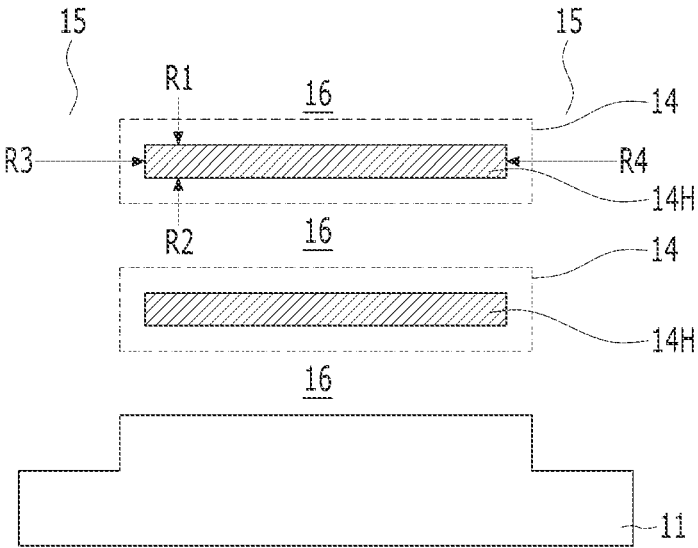

Referring to FIG. 11, the second sacrificial layers 13 and the preliminary horizontal layers 14 may be recessed (refer to reference numerals R1, R2, R3 and R4) through the first openings 15 and the initial horizontal recesses 12'. In order to recess the second sacrificial layers 13 and the preliminary horizontal layers 14, a wet etching process or a dry etching process may be used. According to this embodiment of the present invention, the preliminary horizontal layers 14 may be partially etched until all of the second sacrificial layers 13 are removed. As a result, all of the thin second sacrificial layers 13 may be removed, and the thick preliminary horizontal layers 14 may be thinned as indicated by a reference numeral 14H. A recess process for forming the thin preliminary horizontal layer 14H, that is, the horizontal layer patterns 14H, may be referred to as a thinning process of the preliminary horizontal layers 14. The horizontal layer patterns 14H may be referred to as a thin-body active layer. The horizontal layer patterns 14H may include a monocrystalline silicon layer. While the horizontal layer patterns 14H is formed, the surface of the lower structure 11 may be recessed to a predetermined depth.

Through the above-described recess process, the horizontal layer patterns 14H and the horizontal recesses 16 may be formed. Each of the upper and lower surfaces of the horizontal layer patterns 14H may include a flat surface.

Figure 12:
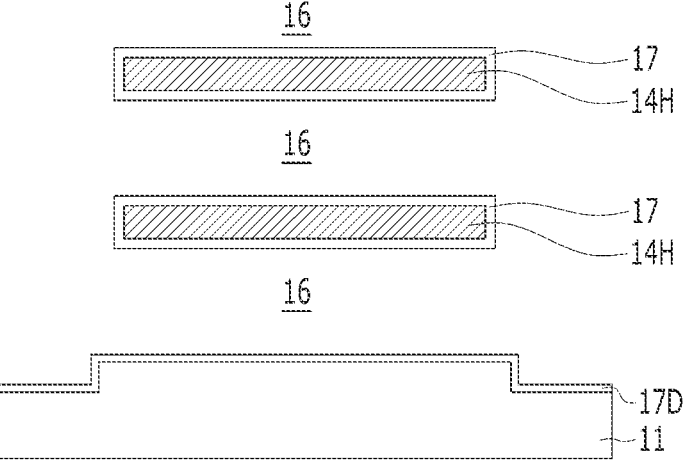

Referring to FIG. 12, a gate dielectric layer 17 may be formed to fully cover the horizontal layer patterns 14H. The gate dielectric layer 17 may be formed by a deposition process or an oxidation process. The gate dielectric layer 17 may include silicon oxide, silicon nitride, a metal oxide, a metal oxynitride, a metal silicate, a high-k material, a ferroelectric material, or an anti-ferroelectric material, or a combination thereof. The gate dielectric layer 17 may include $SiO_2$, $Si_3N_4$, $HfO_2$, $Al_2O_3$, $ZrO_2$, AlON, HfON, HfSiO, HfSiON, or a combination thereof. The gate dielectric layer 17 may be formed by a silicon oxide deposition process. The gate dielectric layer 17 may be formed by oxidizing the surface of the horizontal layer patterns 14H.

According to this embodiment of the present invention, the gate dielectric layer 17 may be formed by an oxidation process, and thus the gate dielectric layer 17 may be formed with a uniform thickness on all the surfaces of the horizontal layer patterns 14H.

While the gate dielectric layer 17 is formed, a first buffer layer 17D may be formed on the surface of the lower structure 11. The gate dielectric layer 17 and the first buffer layer 17D may be formed of the same material.

Figure 13:
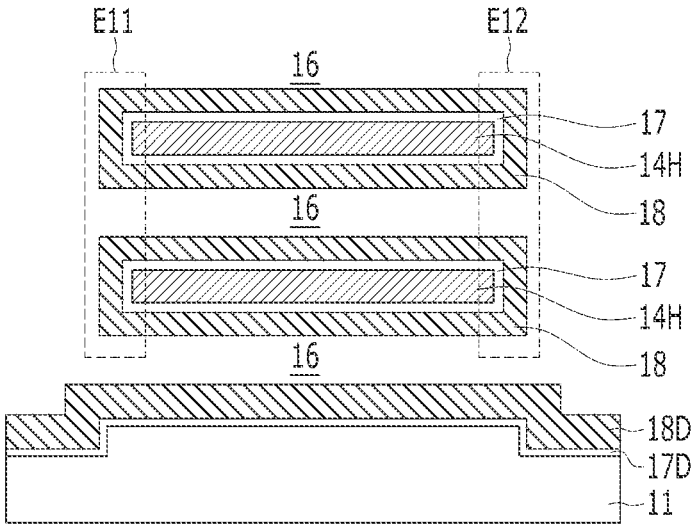

Referring to FIG. 13, a conductive layer 18 may be formed over the gate dielectric layers 17. The conductive layer 18 may include polysilicon, a metal, a metal nitride, a metal carbide, or a combination thereof. The conductive layer 18 may include tungsten, titanium nitride, doped polysilicon, or a combination thereof. The conductive layer 18 may include a metal-based layer. The conductive layer 18 may include materials of different work functions sequentially deposited.

The conductive layer 18 may surround the horizontal layer patterns 14H over the gate dielectric layer 17. The conductive layer 18 may include a first edge portion E11 and a second edge portion E12 that face each other horizontally.

While the conductive layer 18 is formed, a dummy conductive layer 18D may be formed over the first buffer layer 17D. The conductive layer 18 and the dummy conductive layer 18D may be formed of the same material.

Figure 14:
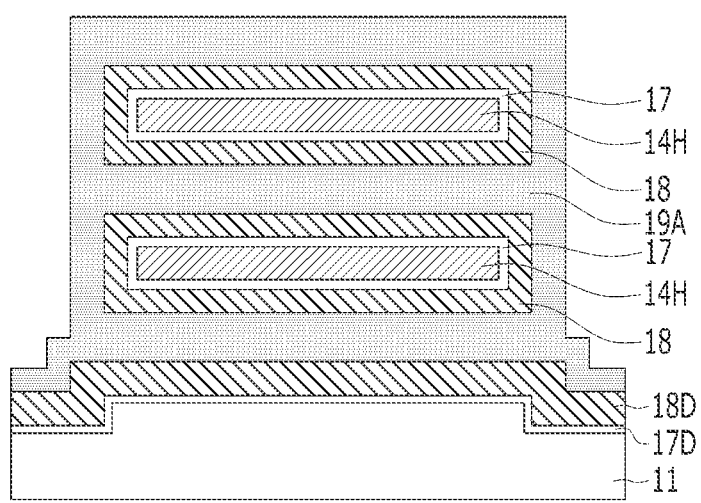

Referring to FIG. 14, a cell dielectric layer 19A may be formed over the conductive layer 18. The cell dielectric layer 19A may fill the space between the vertically neighboring conductive layers 18. The cell dielectric layer 19A may include silicon oxide.

Figure 15:
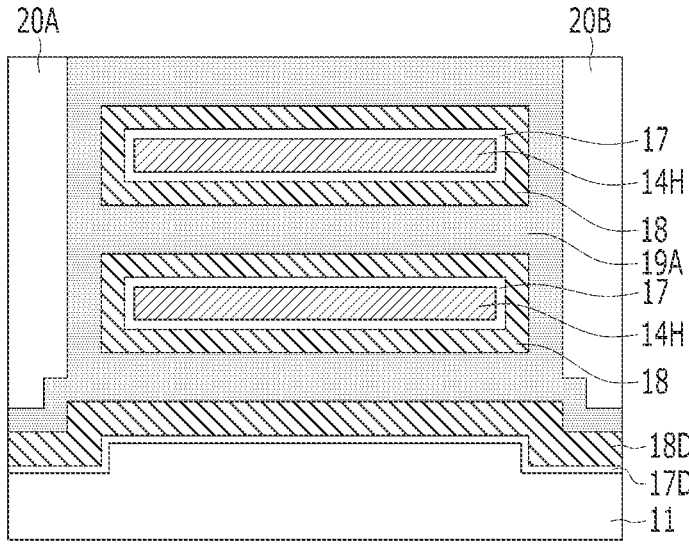

Referring to FIG. 15, sacrificial isolation layers 20A and 20B filling the first openings 15 may be formed. The sacrificial isolation layers 20A and 20B may include a dielectric material, a conductive material, or a combination thereof. The sacrificial isolation layers 20A and 20B may include silicon oxide, silicon nitride, titanium nitride, amorphous carbon, or a combination thereof. The sacrificial isolation layers 20A and 20B may include a first sacrificial isolation layer 20A and a second sacrificial isolation layer 20B.

Figure 16:
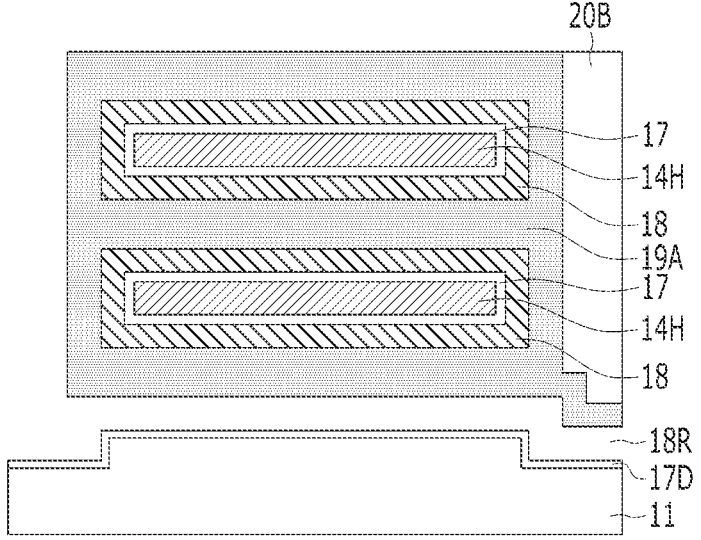

Referring to FIG. 16, one among the sacrificial isolation layers 20A and 20B, e.g., the first sacrificial isolation layer 20A, may be selectively removed. Subsequently, a lower level gap 18R may be formed by removing the dummy conductive layer 18D. While the dummy conductive layer 18D is removed, the first buffer layer 17D and the cell dielectric layer 19A may function as an etch barrier.

Figure 17:
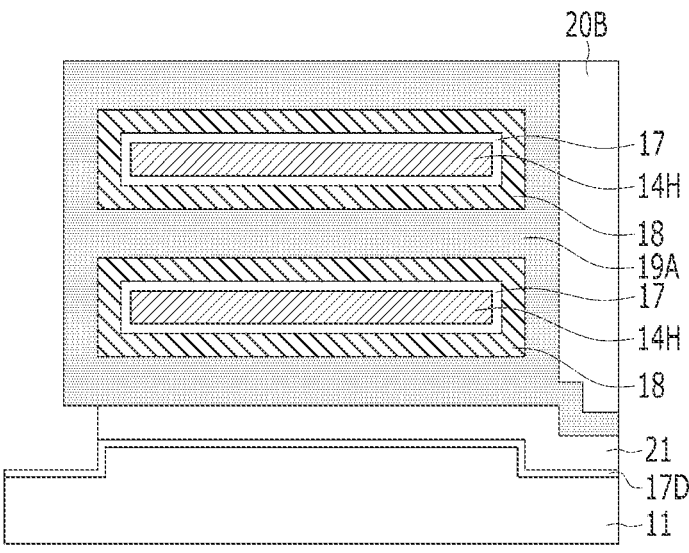

Referring to FIG. 17, a second buffer layer 21 filling the lower level gap 18R may be formed. The second buffer layer 21 may include silicon oxide. Forming the second buffer layer 21 may include depositing silicon oxide to fill the lower level gap 18R and etching the silicon oxide to expose a portion of the first buffer layer 17D.

Figure 18:
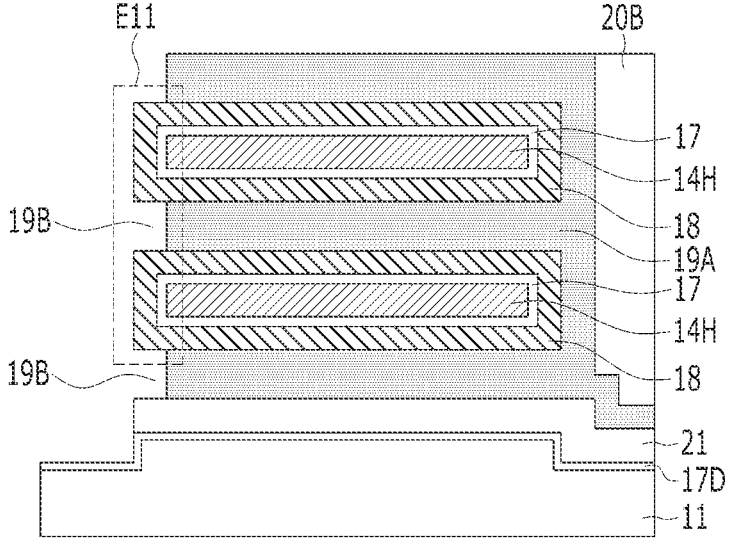

Referring to FIG. 18, the cell dielectric layer 19A may be selectively cut to form cutting portions 19B. As a result, first edge portions E11 of the conductive layer 18 may be exposed by the cutting portions 19B.

Figure 19:
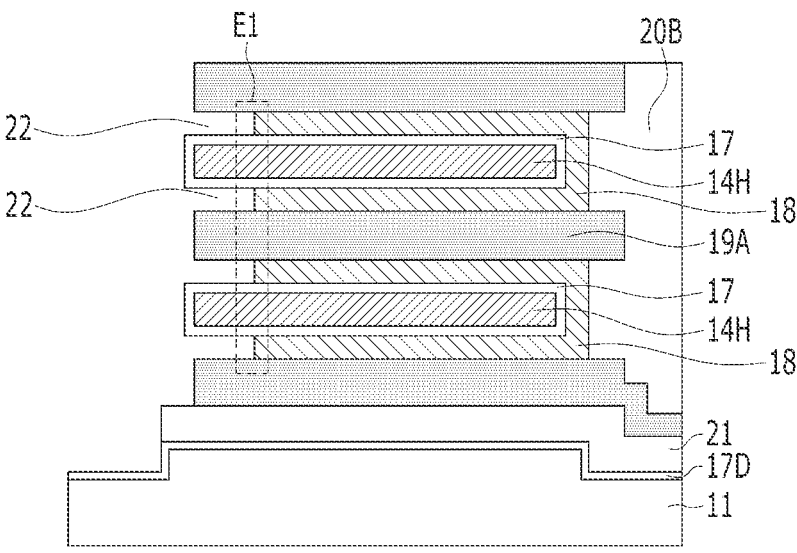

Referring to FIG. 19, the conductive layer 18 may be selectively recessed. As a result, partial recesses 22 may be formed. Portions of the gate dielectric layer 17 may be exposed by the partial recesses 22.

The process of recessing the conductive layer 18 for forming the partial recess portions 22 may be simply referred to as a first recess process of the conductive layer 18.

Figure 20:
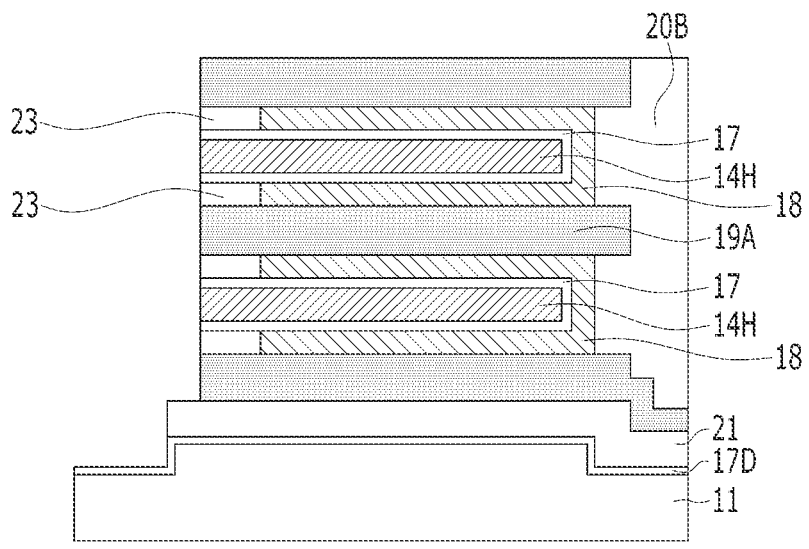

Referring to FIG. 20, a first capping layer 23 filling the partial recesses 22 may be formed. The first capping layer 23 may include silicon oxide, silicon nitride, or a combination thereof. The first capping layer 23 may be formed by depositing a capping material and performing an etch-back process.

Figure 21:
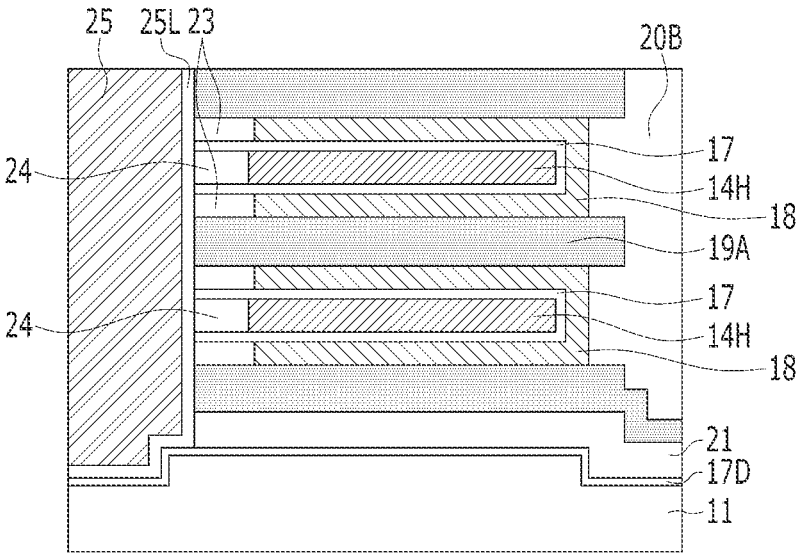

Referring to FIG. 21, a first doped region 24 may be formed over a first side edge of each of the horizontal layer patterns 14H. Forming the first doped region 24 may include depositing polysilicon that is doped with an N-type impurity, performing a heat treatment, and removing the doped polysilicon. The first doped region 24 may include an impurity diffused from the doped polysilicon. According to another embodiment of the present invention, the first doped region 24 may be formed by doping an impurity.

Subsequently, a vertical conductive line 25 may be formed. The vertical conductive line 25 may be commonly coupled to the first doped regions 24. The vertical conductive line 25 may include titanium nitride, tungsten, or a combination thereof. The vertical conductive line 25 may include a bit line.

Before the vertical conductive line 25 is formed, a first contact node 25L may be formed. The first contact node 25L may include doped polysilicon. The first doped region 24 may include an impurity diffused from the first contact node 25L.

According to another embodiment of the present invention, before the vertical conductive line 25 is formed, a first ohmic contact coupled to the first side edges of the horizontal layer patterns 14H may be formed. The first ohmic contact may include a metal silicide. For example, a metal silicide may be formed by sequentially performing a process of depositing a metal layer and an annealing process, and the unreacted metal layer may be removed. The metal silicide may be formed by reacting silicon of the horizontal layer pattern 14H with the metal layer.

Figure 22:
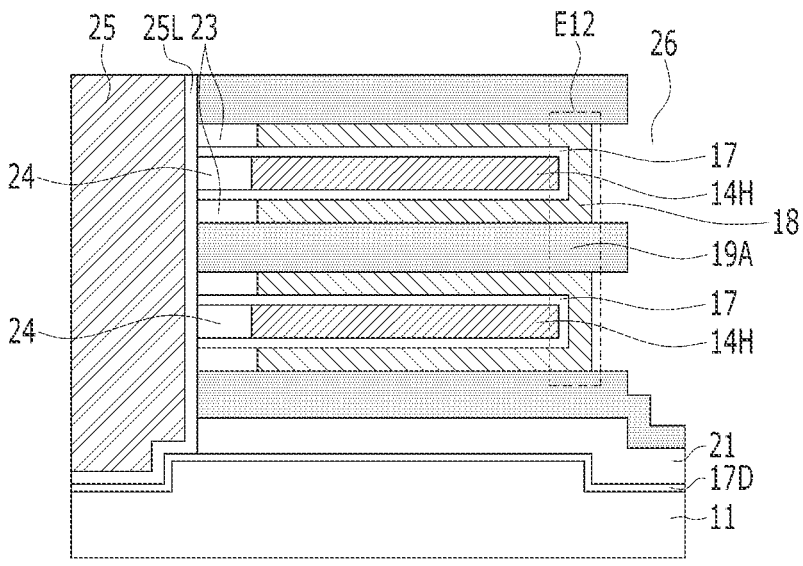

Referring to FIG. 22, the second opening 26 may be formed by removing the second sacrificial isolation layer 20B. The second opening 26 may extend vertically from the surface of the lower structure 11.

The second edge portion E12 of the conductive layer 18 may be exposed by the second opening 26.

Figure 23:
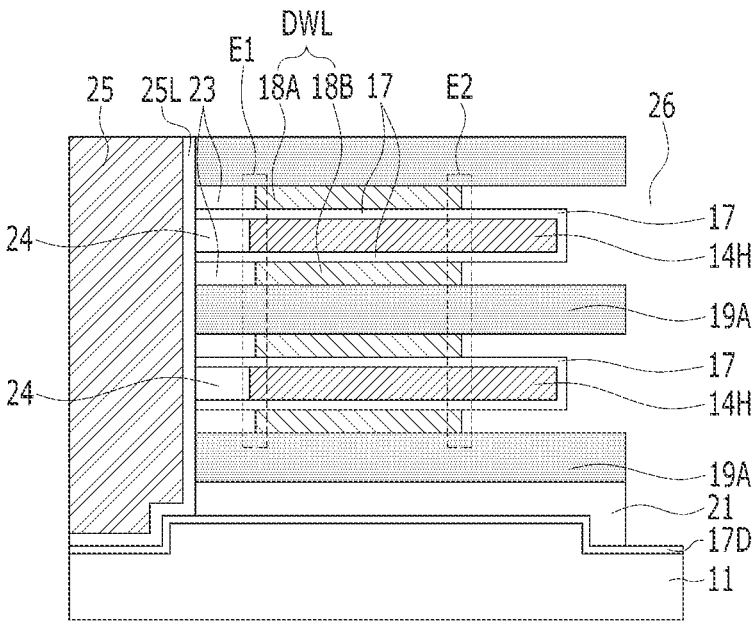

Referring to FIG. 23, the second edge portion E12 of the conductive layer 18 may be selectively recessed through the second opening 26. As a result, a horizontal conductive line DWL including a first horizontal conductive line 18A and a second horizontal conductive line 18B may be formed.

The process of recessing the conductive layer 18 for forming the horizontal conductive line DWL may be simply referred to as a second recess process of the conductive layer 18.

As described above with reference to a series of the processes, forming the horizontal conductive line DWL may include forming the gate dielectric layer 17 that covers the surface of the horizontal layer pattern 14H, forming a conductive layer 18 that surrounds the horizontal layer pattern 14H over the gate dielectric layer 17, and performing the first recess process and the second recess process on the conductive layer 18. A first edge portion (refer to 'E1' in FIG. 19) of the horizontal conductive line DWL may be defined by the first recess process, and a second edge portion (refer to 'E2' in FIG. 23) of the horizontal conductive line DWL may be defined by the second recess process.

Since the first recess process and the second recess process are used to form the horizontal conductive line DWL, the gate oxide intensity (GOI) characteristics of the gate dielectric layer 17 may be improved. The thickness of the gate dielectric layer 17 may be maintained uniformly.

According to another embodiment of the present invention, the first and second horizontal conductive lines 18A and 18B of the horizontal conductive line DWL may have a triple work function electrode structure. As a result, it is possible to improve Gate-Induced Drain Leakage (GIDL).

Figure 24:
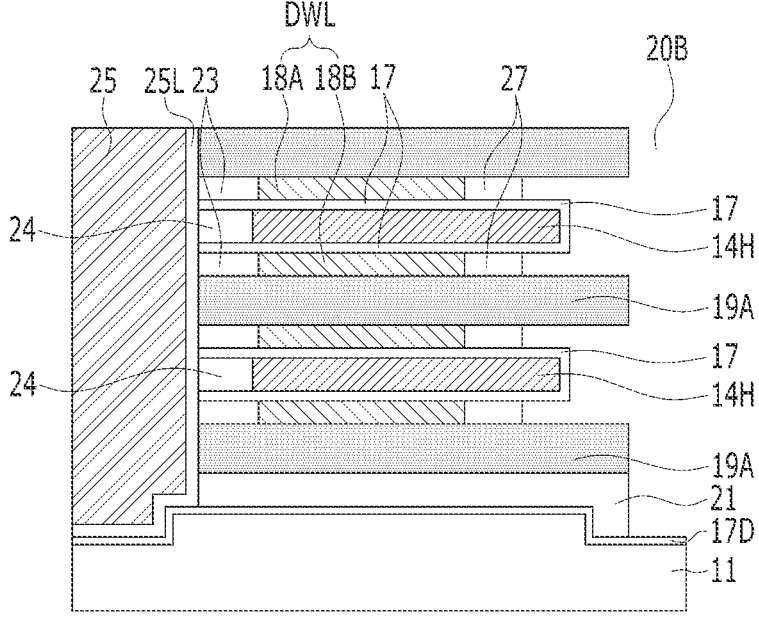

Referring to FIG. 24, second capping layers 27 contacting the first horizontal conductive line 18A and the second horizontal conductive line 18B may be formed. The second capping layer 27 may include silicon oxide, silicon nitride, or a combination thereof. The second capping layer 27 may be formed by depositing a capping material and performing an etch-back process.

Figure 25:
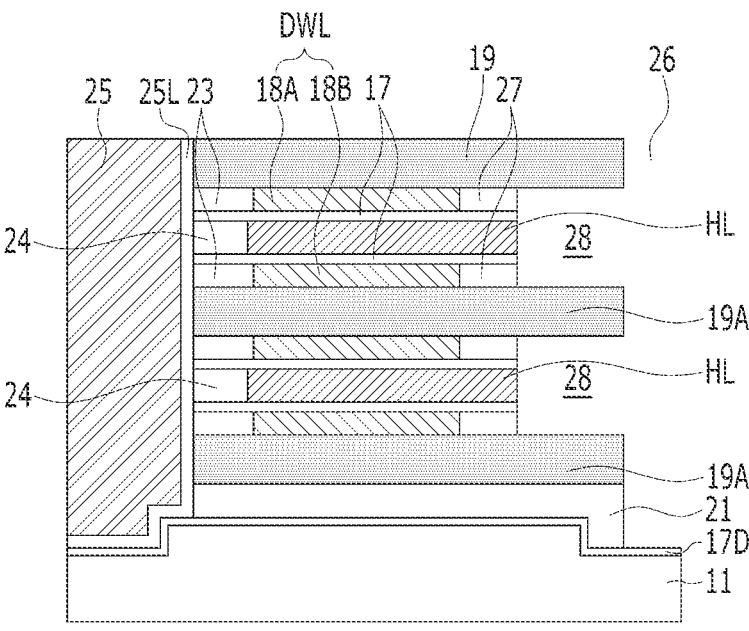

Referring to FIG. 25, the gate dielectric layers 17 and the horizontal layer patterns 14H may be selectively cut. Wide openings 28 may be formed. The horizontal layer patterns 14H may remain as the horizontal layer HL as indicated by a reference symbol 'HL', and a second side edge of the horizontal layer HL may be exposed by the wide opening 28. The wide openings 28 may be disposed between the vertically stacked cell dielectric layers 19A.

Figure 26:
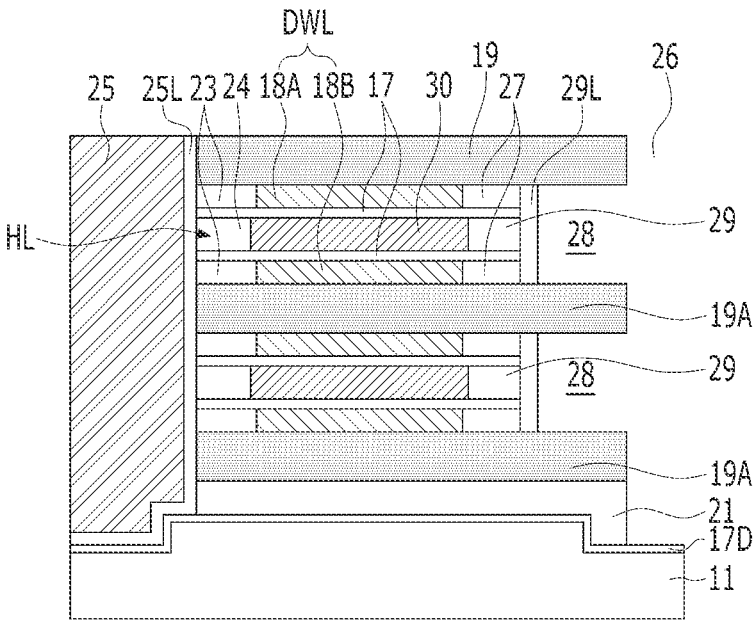

Referring to FIG. 26, a second doped region 29 may be formed over the second side edge of the horizontal layer HL. Forming the second doped region 29 may include depositing polysilicon that is doped with an N-type impurity, performing a heat treatment, and removing the doped polysilicon. The second doped region 29 may include an impurity diffused from doped polysilicon. According to another embodiment of the present invention, the doped polysilicon may remain after the heat treatment. According to another embodiment of the present invention, the second doped region 29 may be formed by doping an impurity.

Subsequently, a second contact node 29L may be formed. The second contact node 29L may include doped polysilicon. The second doped region 29 may include an impurity diffused from the second contact node 29L. Forming the second contact node 29L may include depositing doped polysilicon and performing an etch-back process. The second contact node 29L may be polysilicon that is doped with an N-type impurity.

According to another embodiment of the present invention, a second ohmic contact coupled to the second contact node 29L or the second doped region 29 may be formed. The second ohmic contact may include a metal silicide. For example, a metal silicide may be formed by sequentially performing a process of depositing a metal layer and an annealing process, and the unreacted metal layer may be removed. The metal silicide may be formed by reacting silicon of the horizontal layer HL with the metal layer.

The horizontal layer patterns 14H may be transformed into the horizontal layers HL through a series of the processes described above, and each of the individual horizontal layers HL may include a first doped region 24 and a second doped region 24. Each horizontal layer HL may further include a channel 30, and the channel 30 may be defined between the first doped region 24 and the second doped region 29. The channel 30 may overlap with the horizontal conductive line DWL.

Figure 27:
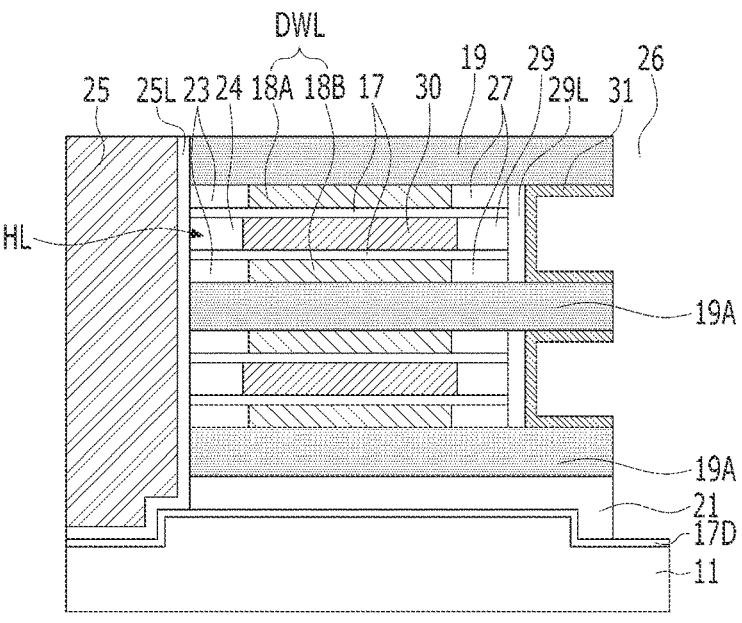

Referring to FIG. 27, a first electrodes 31 of a data storage element may be formed to contact second-side ends of the horizontal layers HL. The first electrode 31 may be formed by depositing a conductive material and performing an etch-back process. The first electrode 31 may include titanium nitride. The first electrode 31 may have a horizontally oriented cylindrical shape.

Figure 28:
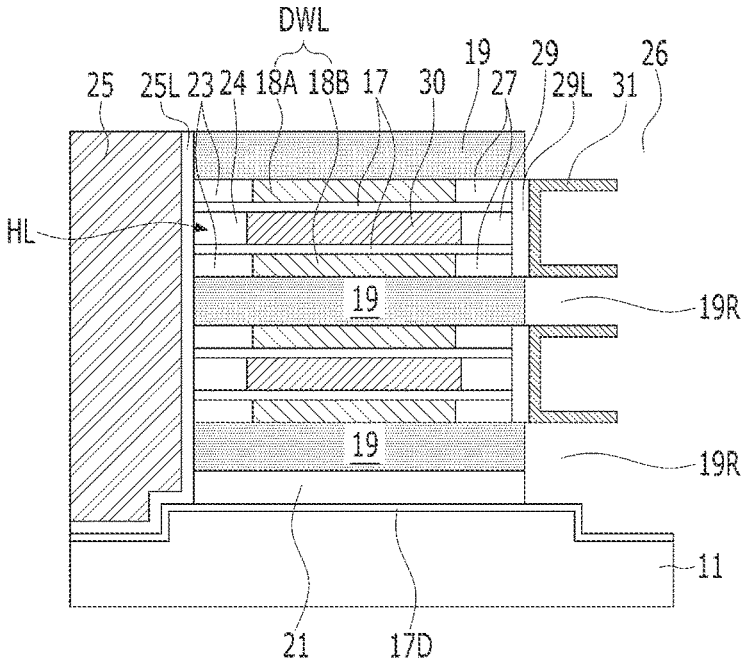

Referring to FIG. 28, the cell dielectric layers 19A may be partially recessed (refer to a reference numeral 19R). As a result, the outer walls of the first electrodes 31 may be exposed. The remaining cell dielectric layers 19 may contact the horizontal conductive line DWL. The remaining cell dielectric layers 19 may be referred to as cell isolation layers.

Figure 29:
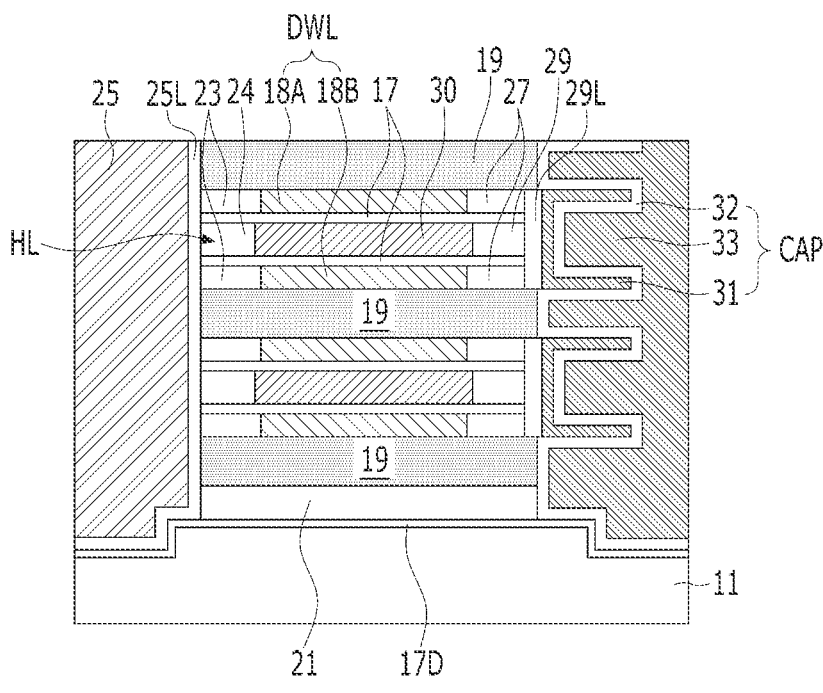

Referring to FIG. 29, a dielectric layer 32 and a second electrode 33 may be sequentially formed over the first electrodes 31. The first electrode 31, the dielectric layer 32 and the second electrode 33 may form a data storage element CAP.

According to FIGS. 9 to 29, since the gate dielectric layer 17 uniformly covers the surface of the horizontal layer patterns 14H, cell gate oxide integrity (GOI) characteristics may be improved.

Also, since the horizontal conductive line DWL is formed by the recess processes of the conductive layer 18, the yield of forming the horizontal conductive line DWL may be improved by suppressing fume of the conductive layer 18.

Figure 30:
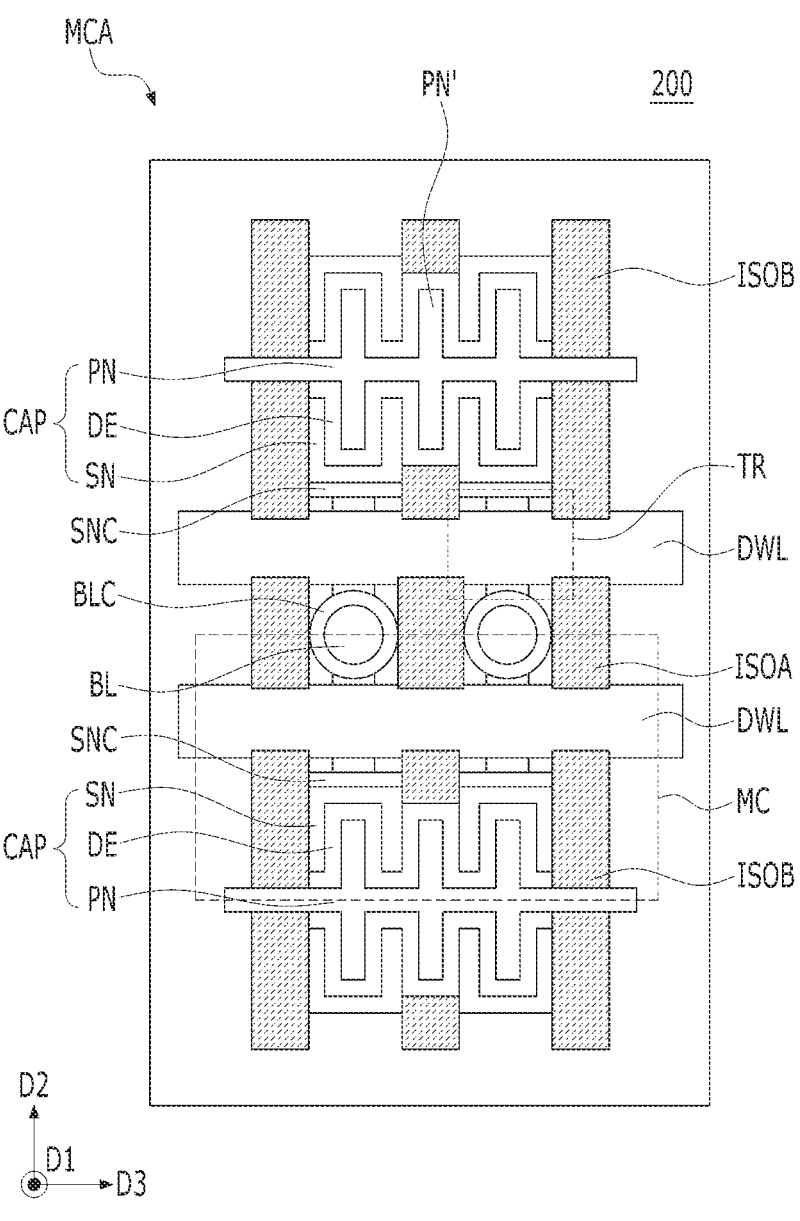
FIG. 30 is a plan view illustrating a semiconductor device in accordance with another embodiment of the present invention.

FIG. 30 is a plan view illustrating a semiconductor device 200 in accordance with another embodiment of the present invention. The semiconductor device 200 of FIG. 30 may be similar to the semiconductor device 100 of FIG. 1.

Referring to FIGS. 1 and 30, the semiconductor device 200 may include a memory cell array MCA. The memory cell array MCA may include a plurality of memory cells MC. The memory cell array MCA may include a three-dimensional (3-D) array of memory cells MC.

Isolation layers ISOA and ISOB may be disposed between the neighboring memory cells MC in the third direction D3. The isolation layers ISOA and ISOB may include a first isolation layer ISOA and a second isolation layer ISOB. The first isolation layer ISOA and the second isolation layer ISOB may include silicon oxide, silicon nitride, silicon carbon oxide (SiCO), or a combination thereof.

Each memory cell MC may include a vertical conductive line BL, a switching element TR, and a data storage element CAP. The first isolation layer ISOA may be disposed between the vertical conductive lines BL in the third direction D3. The second isolation layer ISOB may be disposed between the data storage elements CAP in the third direction D3.

The memory cell array MCA may include a plurality of horizontal conductive lines DWL that are vertically stacked in the first direction D1. The memory cell array MCA may include a plurality of horizontal layers HL that are vertically stacked in the first direction D1. The memory cell array MCA may include a plurality of data storage elements CAP that are vertically stacked in the first direction D1.

The vertical conductive line BL may extend vertically from the top of the lower structure LS in the first direction D1. The horizontal layer HL may extend in the second direction D2 crossing the first direction D1. The horizontal conductive line DWL may extend in the third direction D3 crossing the first and second directions D1 and D2.

The data storage element CAP may include a first electrode SN, a dielectric layer DE, and a second electrode PN. The second electrode PN may include a plurality of outer nodes PN' disposed on the outer wall of the first electrode SN. The outer nodes PN' may be disposed in the second isolation layer ISOB.

Figure 31:
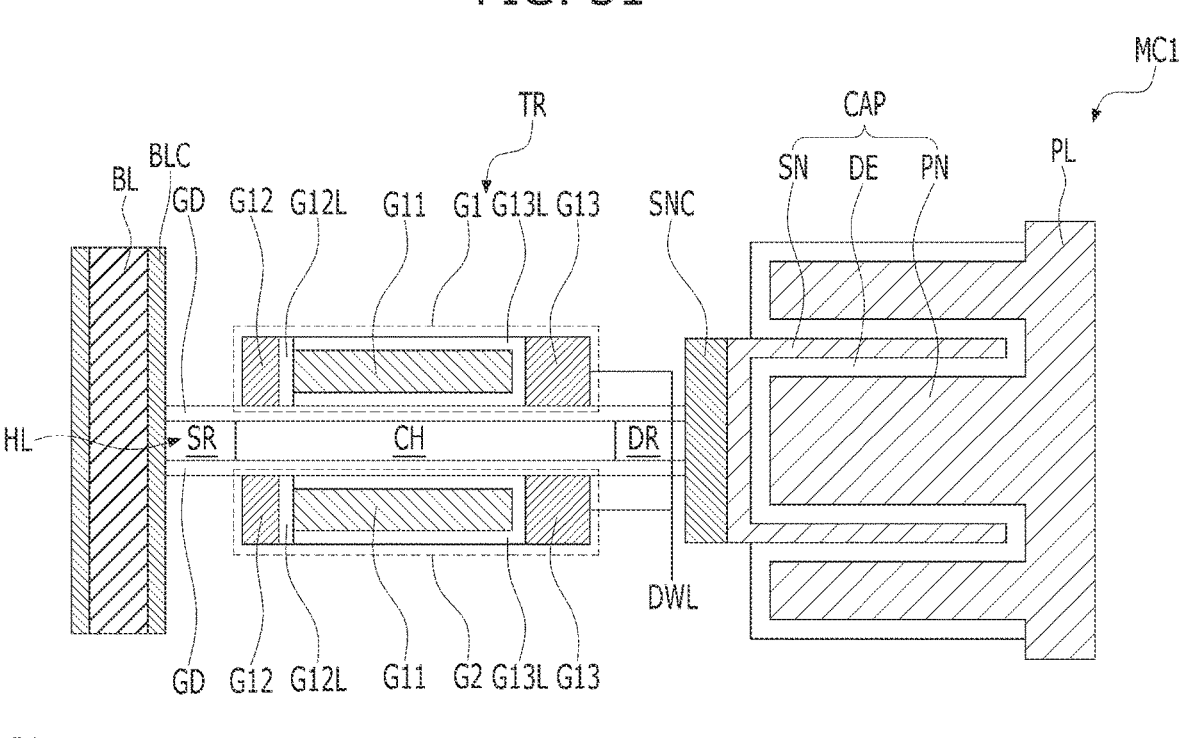
FIG. 31 is a schematic cross-sectional view illustrating a memory cell in accordance with another embodiment of the present invention.
Figure 31:
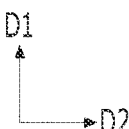

FIG. 31 is a schematic cross-sectional view illustrating a memory cell in accordance with another embodiment of the present invention.

Referring to FIG. 31, the memory cell MC1 may include a vertical conductive line BL, a transistor TR, and a data storage element CAP. The transistor TR may include a horizontal layer HL, a gate dielectric layer GD, and a horizontal conductive line DWL. The horizontal layer HL may include a first doped region SR, a second doped region DR, and a channel CH. The data storage element CAP may include a first electrode SN, a second electrode PN, and a dielectric layer DE.

The memory cell MC1 may further include a first contact node BLC between the vertical conductive line BL and the horizontal layer HL, and a second contact node SNC between the horizontal layer HL and the data storage element CAP. The first and second contact nodes BLC and SNC may include doped polysilicon. The first doped region SR and the second doped region DR may include impurities diffused from the first and second contact nodes BLC and SNC, respectively.

The horizontal conductive line DWL may include a first horizontal conductive line G1 and a second horizontal conductive line G2. Each of the first and second horizontal conductive lines G1 and G2 may include a first work function electrode G11, a second work function electrode G12, and a third work function electrode G13. The first work function electrode G11, the second work function electrode G12, and the third work function electrode G13 may be horizontally disposed in the second direction D2. The first work function electrode G11, the second work function electrode G12, and the third work function electrode G13 may be in parallel to each other while directly contacting each other. The second work function electrode G12 may be disposed adjacent to the vertical conductive line BL, and the third work function electrode G13 may be disposed adjacent to the data storage element CAP. The horizontal layer HL may have a thickness smaller than the thicknesses of the first, second, and third work function electrodes G11, G12, and G13.

The first work function electrode G11, the second work function electrode G12, and the third work function electrode G13 may be formed of materials having different work functions. The first work function electrode G11 may have a higher work function than the second and third work function electrodes G12 and G13. The first work function electrode G11 may include a high work function material. The first work function electrode G11 may have a higher work function than a mid-gap work function of silicon. The second and third work function electrodes G12 and G13 may include a low work function material. The second and third work function electrodes G12 and G13 may have a lower work function than a mid-gap work function of silicon. In other words, the high work function material may have a work function which is higher than approximately 4.5 eV, and the low work function material may have a work function which is lower than approximately 4.5 eV. The first work function electrode G11 may include a metal-based material, and the second and third work function electrodes G12 and G13 may include a semiconductor material.

The second and third work function electrodes G12 and G13 may include N-type dopant doped polysilicon. The first work function electrode G11 may include a metal, a metal nitride, or a combination thereof. The first work function electrode G11 may include tungsten, titanium nitride, or a combination thereof. A barrier material may be further formed between the second and third work function electrodes G12 and G13 and the first work function electrode G11.

According to this embodiment of the present invention, each of the first and second horizontal conductive lines G1 and G2 of the horizontal conductive line DWL may be horizontally disposed in the order of to the second work function electrode G12—the first work function electrode G11—the third work function electrode G13 in the second direction D2. The first work function electrode G11 may include a metal, and the second work function electrode G12 and the third work function electrode G13 may include polysilicon.

Each of the first and second horizontal conductive lines G1 and G2 of the horizontal conductive line DWL may have a structure of Polysilicon-Metal-Polysilicon (PMP) that are horizontally disposed in the second direction D2. In the PMP structure, the first work function electrode G11 may be a metal-based material, and the second and third work function electrodes G12 and G13 may be doped polysilicon which is doped with an N-type dopant. The N-type dopant may include phosphorus or arsenic.

A first barrier layer G12L may be disposed between the first work function electrode G11 and the second work function electrode G12. A second barrier layer G13L may be disposed between the first work function electrode G11 and the third work function electrode G13. The first and second barrier layers G12L and G13L may include titanium nitride, tantalum nitride, tungsten nitride, or molybdenum nitride. The second barrier layer G13L may cover the upper surface, lower surface, and one side of the first work function electrode G11.

The first work function electrode G11 may have a larger volume than the second and third work function electrodes G12 and G13, and thus, the horizontal conductive line DWL may have a low resistance. The first work function electrodes G11 of the first and second horizontal conductive lines G1 and G2 may vertically overlap in the first direction D1 with the horizontal layer HL interposed therebetween. The second and third work function electrodes G12 and G13 of the first and second horizontal conductive lines G1 and G2 may vertically overlap in the first direction D1 with the horizontal layer HL interposed therebetween. The overlapping area between the first work function electrode G11 and the horizontal layer HL may be greater than the overlapping area between the second and third work function electrodes G12 and G13 and the horizontal layer HL. The second and third work function electrodes G12 and G13 and the first work function electrode G11 may extend in the third direction D3, and the second and third work function electrodes G12 and G13 and the first work function electrode G11 may directly contact.

As described above, each of the first and second horizontal conductive lines G1 and G2 may have a triple electrode structure including the first, second and third work function electrodes G11, G12 and G13. The horizontal conductive line DWL may include a pair of first work function electrodes G11, a pair of second work function electrodes G12, and a pair of third work function electrodes G13 extending in the third direction D3 crossing the horizontal layer HL with the horizontal layer HL interposed therebetween. The first work function electrodes G11 of the horizontal conductive line DWL may vertically overlap with the channel CH, and the second work function electrodes G12 of the horizontal conductive line DWL may vertically overlap with the first doped region SR of the horizontal layer HL, and the third work function electrodes G13 of the horizontal conductive line DWL may vertically overlap with the second doped region DR of the horizontal layer HL.

The first work function electrode G11 of a high work function may be disposed at the center of the horizontal conductive line DWL, and the second and third work function electrodes G12 and G13 of low work functions may be disposed at both ends of the horizontal conductive line DWL, improving leakage current, such as Gate-Induced Drain Leakage (GIDL).

As the first work function electrode G11 of a high work function is disposed at the center of the horizontal conductive line DWL, the threshold voltage of the switching element TR may be increased. Since the second work function electrode G12 of the horizontal conductive line DWL has a low work function, a low electric field may be formed between the vertical conductive line BL and the horizontal conductive line DWL. Since the third work function electrode G13 of the horizontal conductive line DWL has a low work function, a low electric field may be formed between the data storage element CAP and the horizontal conductive line DWL.

As described above, the memory cell MC1 may include the horizontal conductive line DWL of a triple work function electrode structure. Each of the first and second horizontal conductive lines G1 and G2 of the horizontal conductive line DWL may include a first work function electrode G11, a second work function electrode G12, and a third work function electrode G13. The first work function electrode G11 may overlap with the channel CH, and the second work function electrode G12 may be disposed adjacent to the vertical conductive line BL and the first doped region SR, and the third work function electrode G13 may be disposed adjacent to the data storage element CAP and the second doped region DR. Due to the low work function of the second work function electrode G12, a low electric field may be formed between the horizontal conductive line DWL and the vertical conductive line BL, thereby improving leakage current. Due to the low work function of the third work function electrode G13, a low electric field may be formed between the horizontal conductive line DWL and the data storage element CAP, thereby improving leakage current. The high work function of the first work function electrode G11 may form a high threshold voltage of the switching element TR and decrease the height of the memory cell MC1 by forming a low electric field, which is advantageous in terms of integration degree.

According to the embodiment of the present invention, since a mesh-shaped main hard mask pattern is used as an etch barrier to form isolation openings of different sizes, critical dimension uniformity of the isolation openings may be improved.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming a stack body including first sacrificial layer structures, preliminary horizontal layers, and second sacrificial layer structures over a lower structure;
   forming a main hard mask layer over the stack body;
   forming a mesh-shaped hard mask pattern over the main hard mask layer;
   forming a main hard mask pattern by etching the main hard mask layer using the mesh-shaped hard mask pattern as an etch barrier;
   forming a plurality of isolation openings by etching the stack body using the main hard mask pattern as an etch barrier; and
   forming a plurality of isolation layers that fill the isolation openings.

2. The method of claim 1, further comprising:
   after the forming of the isolation layers,
   forming first openings in the stack body;
   removing the first sacrificial layer structures and the second sacrificial layer structures through the first openings;
   forming horizontal layer patterns by recessing the preliminary horizontal layers;
   forming a gate dielectric layer that covers the horizontal layer pattern; and
   forming a pair of horizontal conductive lines vertically facing each other with the horizontal layer pattern interposed therebetween over the gate dielectric layer.

3. The method of claim 2, wherein the gate dielectric layer fully covers top and bottom surfaces of the horizontal layer pattern.

4. The method of claim 2, wherein the gate dielectric layer is formed by a process of depositing silicon oxide or a process of oxidizing a surface of the horizontal layer pattern.

5. The method of claim 2, further comprising:
   forming a vertical conductive line that is coupled to a first side of the horizontal layer pattern; and
   forming a data storage element that is coupled to a second side of the horizontal layer pattern.

6. The method of claim 2, wherein the preliminary horizontal layer and the horizontal layer pattern include a monocrystalline silicon layer.

7. The method of claim 1, wherein each of the first and second sacrificial layer structures includes a stack of a first silicon germanium layer, a first monocrystalline silicon layer, and a second silicon germanium layer, and
   the preliminary horizontal layers include a second monocrystalline silicon layer that is thicker than the first monocrystalline silicon layer.

8. The method of claim 1, wherein the forming of the mesh-shaped hard mask pattern includes:
   forming a first hard mask layer over the main hard mask layer;
   forming a second hard mask layer over the first hard mask layer;
   forming a line-shaped second hard mask pattern by patterning the second hard mask layer; and
   forming a line-shaped first hard mask pattern crossing the second hard mask pattern by patterning the first hard mask layer.

9. The method of claim 8, wherein each of the first hard mask layer and the second hard mask layer includes a stack of amorphous carbon and silicon oxynitride.

10. The method of claim 8, wherein the forming of the line-shaped second hard mask pattern includes:

forming a line-shaped first photoresist pattern over the second hard mask layer; and etching the second hard mask layer by using the first photoresist pattern as an etch barrier.

11. The method of claim 8, wherein the forming of the line-shaped first hard mask pattern includes:

forming a third hard mask layer over the second hard mask pattern;

forming a line-shaped second photoresist pattern over the third hard mask layer;

forming a third hard mask pattern by etching the third hard mask layer using the second photoresist pattern as an etch barrier; and etching the first hard mask layer by using the third hard mask pattern and the second hard mask pattern.

12. A method for fabricating a semiconductor device, comprising:

forming an etch target layer including silicon germanium layers and monocrystalline silicon layers over a lower structure;

forming a main hard mask layer over the etch target layer;

forming a multi-level hard mask layer over the main hard mask layer;

forming a mesh-shaped hard mask pattern by performing a double patterning process on the multi-level hard mask layer;

forming a main hard mask pattern by etching the main hard mask layer using the mesh-shaped hard mask pattern as an etch barrier;

forming a plurality of small openings and a plurality of large openings by etching the etch target layer using the main hard mask pattern as an etch barrier; and forming a plurality of dielectric layers that fill the small openings and the large openings.

13. The method of claim 12, wherein the forming of the mesh-shaped hard mask pattern includes:

forming a first hard mask layer over the main hard mask layer;

forming a second hard mask layer over the first hard mask layer;

forming a line-shaped second hard mask pattern by patterning the second hard mask layer; and forming a line-shaped first hard mask pattern crossing the second hard mask pattern by patterning the first hard mask layer.

14. The method of claim 13, wherein each of the first hard mask layer and the second hard mask layer includes a stack of amorphous carbon and silicon oxynitride.

15. The method of claim 13, wherein the forming of the line-shaped second hard mask pattern includes:

forming a line-shaped first photoresist pattern over the second hard mask layer; and etching the second hard mask layer by using the first photoresist pattern as an etch barrier.

16. The method of claim 13, wherein the forming of the line-shaped first hard mask pattern includes:

forming a third hard mask layer over the second hard mask pattern;

forming a line-shaped second photoresist pattern over the third hard mask layer;

forming a third hard mask pattern by etching the third hard mask layer using the second photoresist pattern as an etch barrier; and etching the first hard mask layer by using the third hard mask pattern and the second hard mask pattern.

17. The method of claim 12, further comprising:

after the forming of the dielectric layers, forming first openings in the etch target layer;

removing the silicon germanium layers through the first openings;

forming monocrystalline silicon layer patterns by recessing the monocrystalline silicon;

forming a gate dielectric layer that fully covers the monocrystalline silicon layer patterns; and forming a pair of horizontal conductive lines vertically confronting each other with the monocrystalline silicon layer patterns interposed therebetween over the gate dielectric layer.

* * * * *